United States Patent [19]
Sakata et al.

[11] Patent Number: 5,952,683
[45] Date of Patent: Sep. 14, 1999

[54] FUNCTIONAL SEMICONDUCTOR ELEMENT WITH AVALANCHE MULTIPLICATION

[75] Inventors: Haruhisa Sakata, Ohmiya; Katsuyuki Utaka, Kiyose; Yuichi Matsushima, Tokorozawa, all of Japan

[73] Assignee: Kokusai Denshin Denwa Kabushiki Kaisha, Tokyo-To, Japan

[21] Appl. No.: 08/892,775

[22] Filed: Jul. 15, 1997

Related U.S. Application Data

[63] Continuation of application No. 08/491,409, Jun. 16, 1995, abandoned.

[30] Foreign Application Priority Data

Jun. 22, 1994 [JP] Japan ..................................... 6-162955

[51] Int. Cl.$^6$ ........................ H01L 31/072; H01L 31/017
[52] U.S. Cl. ............................ 257/186; 257/39; 257/105; 257/85
[58] Field of Search ............................ 257/39, 104, 105, 257/84, 85, 186

[56] References Cited

U.S. PATENT DOCUMENTS 4,839,706  6/1989  Brennan .................................. 257/186

OTHER PUBLICATIONS

Chen *Appl Phys Lett* 39(12), Dec. 15, 1981 "Theory of a Modulated Barrier Photodiode".

Kovacic et al *IEEE Elec. Dev. Lett.* vol. 14 No. 2 Feb. 1993 "InP/InGaAsP . . . Switch".

Sze, *Physics of Semiconductor Devices*, 1982 pp. 766–777 John Wiley & Sons N.Y.

Sze, *Physics of Semiconductor Devices* 1982.

*Primary Examiner*—Jerome Jackson, Jr.
*Attorney, Agent, or Firm*—Lackenbach Siegel Marzullo & Aronson

[57] ABSTRACT

A functional semiconductor element, which is designed to perform an ultrafast amplifying, bistable, similar functional operation by initiating and stopping an avalanche multiplication in one of i-type layers of what is called a triangular barrier diode (TBD) structure having an n-i-p-i-n, p-i-n-i-p, n-i-p-i-p, n-i-n-i-p, n-i-n-i-n, p-i-n-i-n, p-i-p-i-p, or p-i-p-i-n configuration. By forming a light absorbing layer and a light emitting layer or light modulating layer in this structure, it is possible to function the element as an optical functional element. Furthermore, the addition of a resonant tunneling diode implements a novel function.

14 Claims, 32 Drawing Sheets

Fig. 9
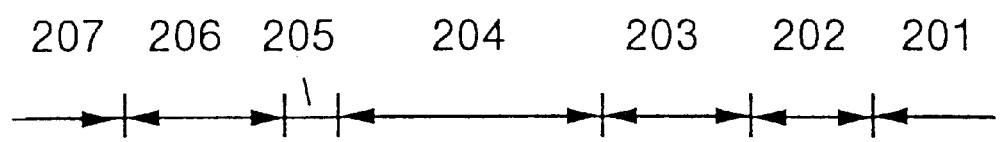
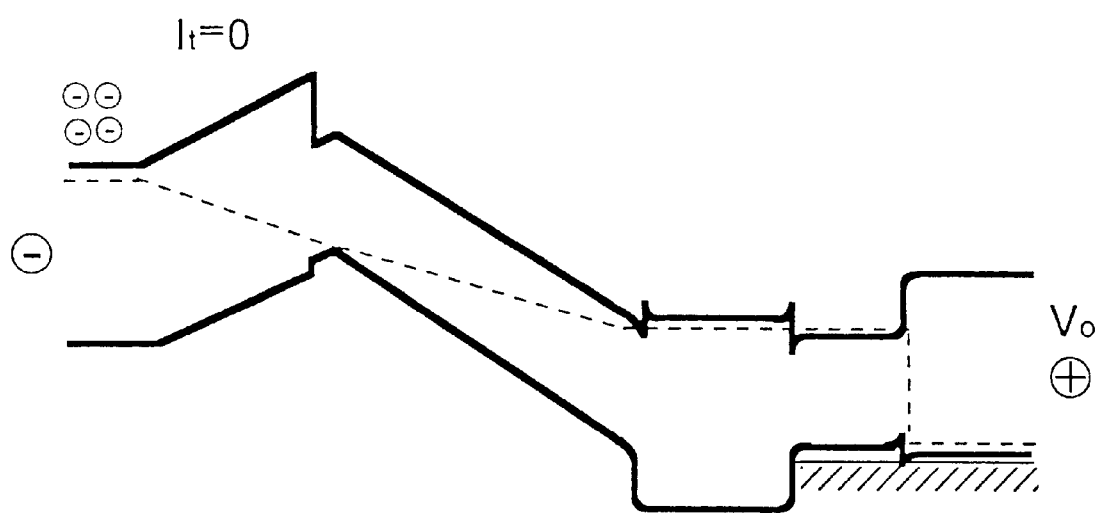

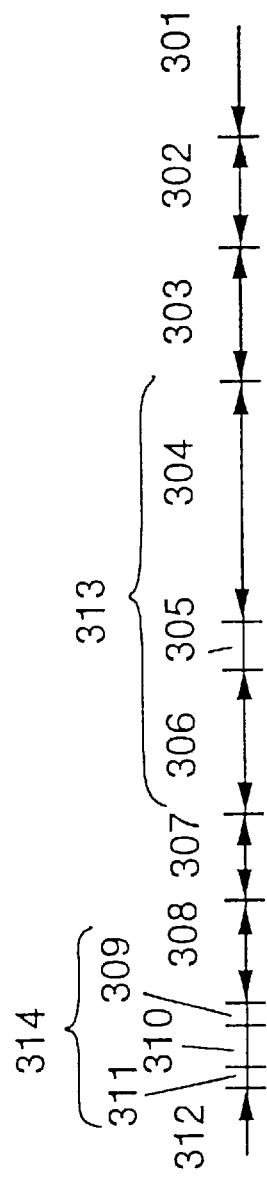
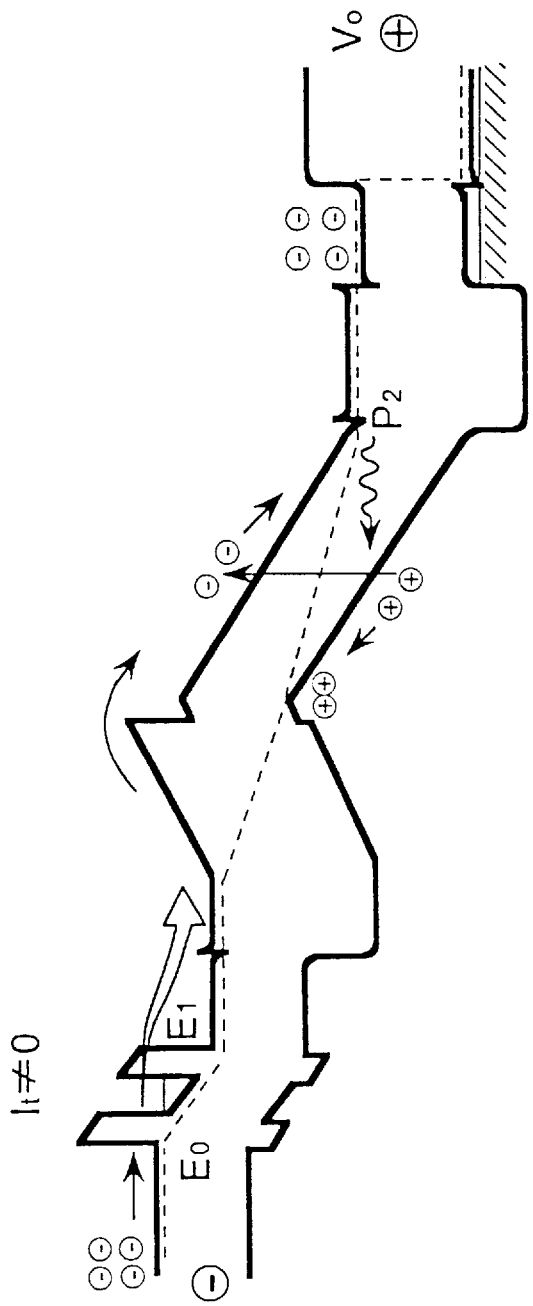
Fig. 17

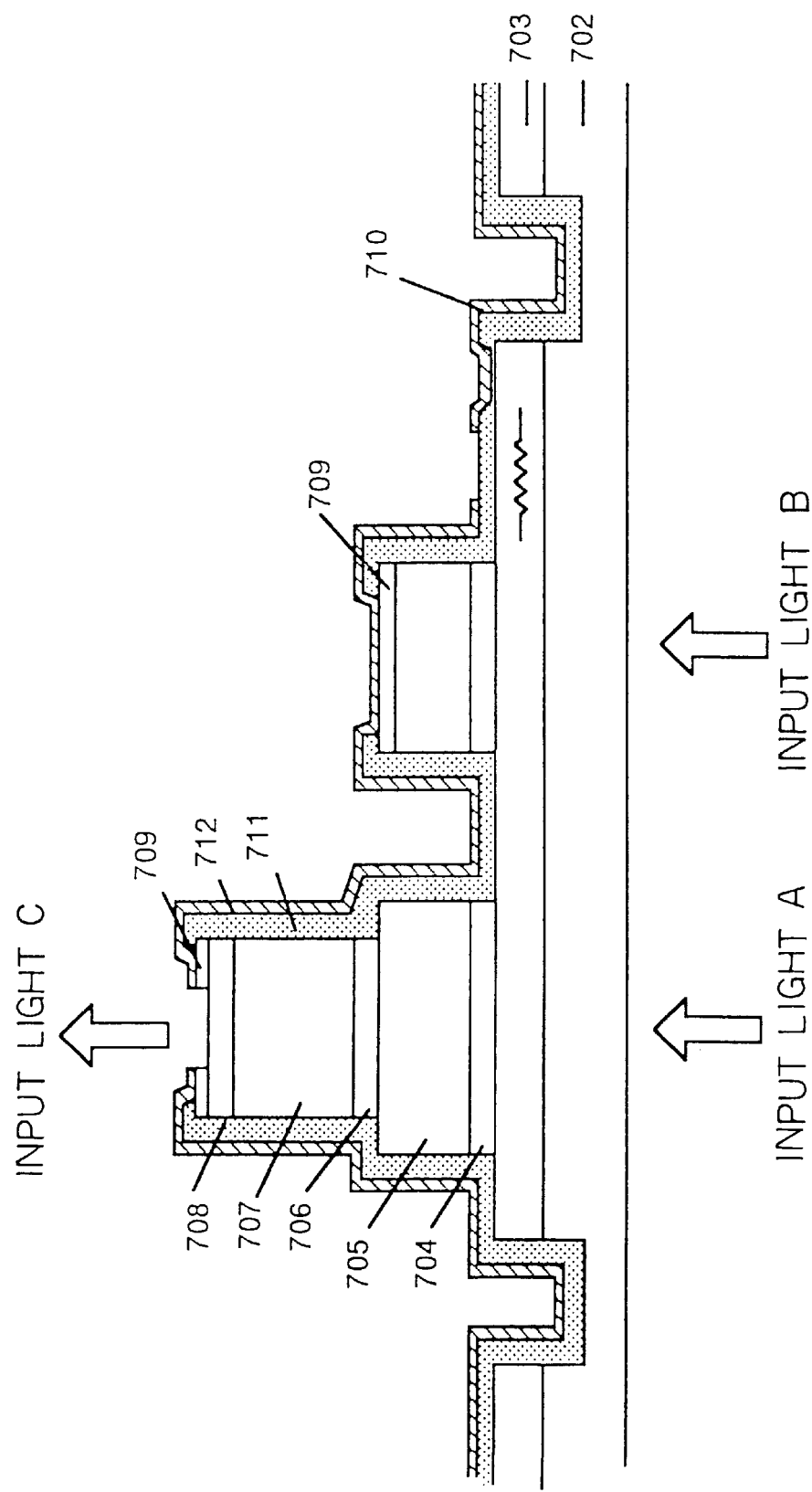

FUNCTIONAL SEMICONDUCTOR ELEMENT WITH AVALANCHE MULTIPLICATION

This is a continuation of application Ser. No. 08/491,409, filed Jun. 16, 1995, now abandoned.

BACKGROUND OF THE INVENTION

The present invention relates to a functional semiconductor element for electrically and optically controlling signals which is indispensable to fast signal processing in the fields of switching and information processing.

It is now expected that wide-band, new services which utilize super wide band, ultrafast transmission, such as picture communication and video distribution, will become widespread. In this instance, ultrafast signal processing is indispensable at nodes to which wide-band signals concentrate. To meet this requirement, there has been called for capabilities in electrical or optical processing which permit a fast switching operation and further reduction of the processing time through parallel processing.

One of important functions in signal processing is a logic/arithmetic function. The implementation of such a function requires an electronic or optical device which performs and AND or OR operation as a logical operation which provides a different output signal, depending on whether all or any one of a plurality of bits is a "1" or not.

In FIG. 29 there is shown the band structure of an electronic device which performs an amplifying operation according to the prior art. Reference numeral 501 denotes an n-GaAs layer, 502 an i-GaAs layer, 503 a p-GaAs layer, 504 an i-GaAs layer, and 505 an n-GaAs layer. This device has what is called an n-i-p-i-n triangular barrier diode structure (TBD); the device is provided with source, gate and drain layers and is able to amplify a majority carrier flow by changing the voltage of an electrode mounted on the p-type gate layer. This device features a thin p-type gate layer, and hence permits a fast passage of carriers through the gate layer. FIG. 30 shows the gate voltage dependence of the current-voltage characteristic of this device. $V_{G1}$ to $V_{G4}$ denote gate voltages. Thus, this device is capable of performing the amplifying operation on the basis of the gate voltage and hence is promising in terms of fast operation, but its function is limited specifically to the amplifying operation as is the case with other transistors.

FIG. 31 shows the band structure of an optical device which performs an amplifying operation according to the prior art. Reference numeral 601 denotes an n-GaAs layer, 602 an i-GaAs layer, 603 a p-GaAs layer, 604 an i-AlGaAs layer, and 605 an n-AlGaAs layer. This device also has the so-called n-i-p-i-n triangular barrier diode structure (TBD) and is provided with source, gate and drain layers. By biasing and irradiating this device with light, minority carriers are generated in the drain layer and stored in the p-type layer to thereby change its potential, permitting the amplification of a majority carrier flow. This device also features a very thin gate layer, which allows carriers to pass therethrough at a high speed. In FIG. 32 there is shown the input-light power dependence of the current-voltage characteristic of this device. $P_1$ to $P_3$ denote the input-light power. This device is promising in terms of high-speed operation but has, as its function, only the amplifying operation as is the case with ordinary phototransistors.

In FIG. 33 there is shown a conventional XOR optical logic element. Reference numerals 700 and 700' denote phototransistors (HPT) each composed of an n-InP layer, a p-InGaAsP layer and an n-InP layer, and 701 and 701' LEDs each composed of an n-InP layer, In AsP layer and a p-InP layer. The LEDs are each connected in series to one of the two HPTs of the respective pairs which are simultaneously irradiated with input lightwaves A and B; two such units are connected in parallel to the power supply. FIG. 34 depicts the sectional structure of the unit cell surrounded by the one-dot chain line. Reference numeral 702 a semi-insulating InP layer, 703 an n-InP layer, 704 a p-InGaAsP layer, 705 an n-InP layer, 706 an InGaAsP layer, 707 a p-InP layer, 708 a p-InGaAsP layer, 709 an Au-Zu layer, 710 an Au-Sn layer, 711 a polyimide layer, and 712 a Ti/Au layer; the layers InGaAsP layers 704 and 706 correspond to the base layer of each HPT and the light emitting layer of each LED, respectively. When only the input light A (B; reference characters or numerals inside and output the parentheses correspond to each other in the following description) is incident on the device as shown in FIG. 34, the HPTs 700 (700') are tuned ON and the HPTs 700' (700) connected thereto are turned OFF, and consequently, only the LED 701 (701') emits light. On the other hand, when the input light A and B are simultaneously incident on the device, only the HPTs that are not connected to the LEDs 701 and 701' are turned ON, and consequently, neither of the LEDs 701 and 701' are supplied with current and emit light. When either the input light A or B are not incident, no current flows to anywhere, and hence no light is emitted. From these operations, it will be seen that the sums of the input light A and B and output light C and D from the LEDs just bear the exclusive-OR (XOR) relationship.

The electronic or optical device of such a conventional triangular barrier diode (TBD) type structure as described above does not possess a function of causing and stopping an avalanche multiplication. Hence, the device does not possess the function as an amplifying device which utilizes the avalanche multiplication; furthermore, it is equipped with a bistable or similar function through use of a feedback operation of another functional element part connected to the outside. This, however, introduces complexity in the device structure and lowers its response speed accordingly.

SUMMARY OF THE INVENTION

It is an object of the present invention to provide a novel functional semiconductor element which performs an amplifying operation or bistable functional operation by the use of the avalanche multiplication.

To attain the above object, the functional semiconductor element according to the present invention has what is called a triangular barrier diode (TBD) structure with a n-i-p-i-n, p-i-n-i-p, n-i-p-i-p, n-i-n-i-p, n-i-n-i-n, p-i-n-i-n, p-i-p-i-p, or p-i-p-i-n structure and is capable of an ultrafast amplifying or bistabilizing functional operation by causing and stopping avalanche multiplication in the i-type layers. It is also possible to operate this element as an optical functional element by including a light absorbing layer and a light emitting layer or light modulating layer in this structure; moreover, the addition of a resonant tunneling diode provides the element with a new function.

BRIEF DESCRIPTION OF THE DRAWINGS

The present invention will be described in detail below with reference to accompanying drawings, in which:

FIG. 9 is a band diagram of the second embodiment of the present invention with no light incident thereon;

FIG. 17 is a band diagram of the third embodiment of the present invention with input-light power $P_2$ thereon;

FIG. 34 is a sectional view showing an example of a conventional function semiconductor optical element.

PREFERRED EMBODIMENTS OF THE INVENTION

With reference to the accompanying drawings, the present invention will hereinafter be described in detail as being applied to the n-i-p-i-n structure.

[Embodiment 1]

Figure 1:
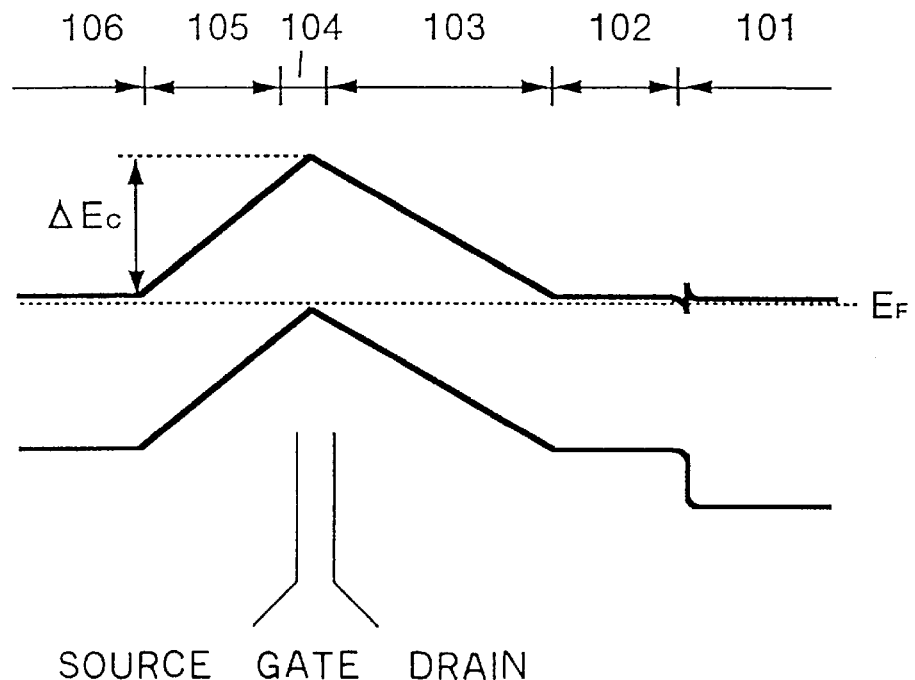
FIG. 1 is a band diagram of a first embodiment of the functional semiconductor element of the present invention in a thermal equilibrium condition.

Now, the functional operation of an electronic device will be described using an InGaAsP/InGaAlAs semiconductor. FIG. 1 is the band diagram of the functional semiconductor element of the present invention when it is not biased. Reference numeral 101 denotes an n-InP layer used as a substrate, 102 an n-InGaAlAs or n-InGaAsP layer (about 1 to 2 $\mu$m thick), 103 an i-InGaAlAs or i-InGaAsP layer (about 1 to 2 $\mu$m thick), 104 a p-InGaAlAs or p-InGaAsP layer (about 6 nm thick), 105 an i-InGaAlAs or i-InGaAsP layer (about 50 to 200 nm thick), and 106 an n-InGaAlAs or n-InGaAsP layer (about 0.1 to 0.5 $\mu$m thick). The broken lines indicate the Fermi levels.

Figure 2:
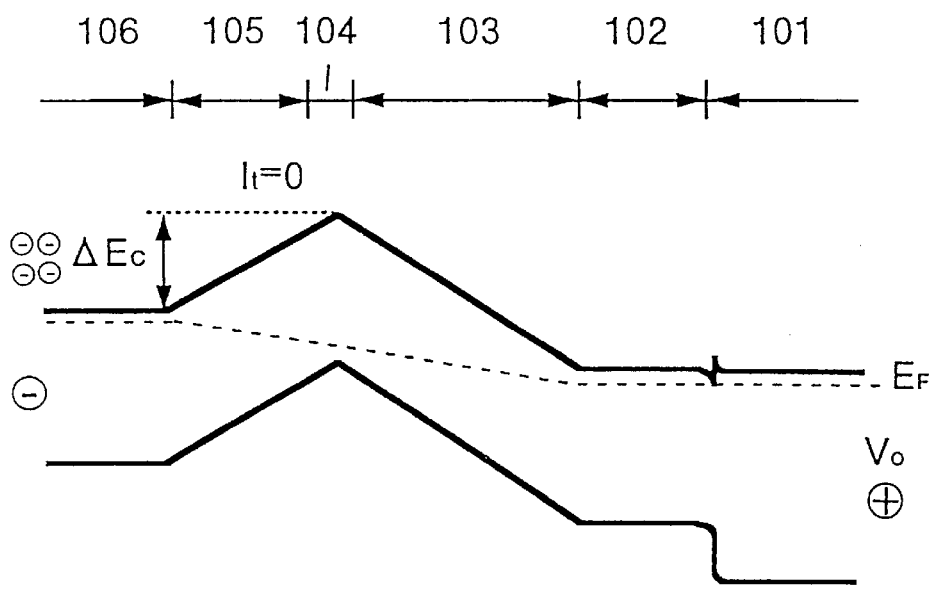
FIG. 2 is a band diagram of the first embodiment of the present invention with no gate voltage applied.
Figure 3:
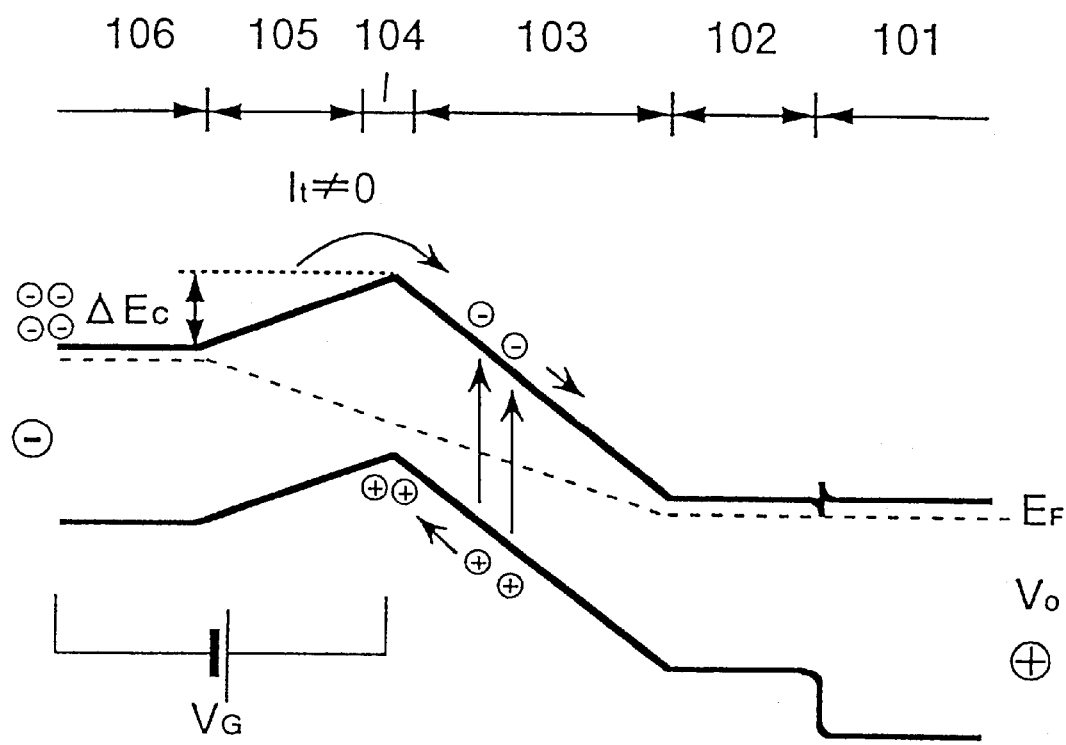
FIG. 3 is a band diagram of the first embodiment of the present invention with a gate voltage applied.
Figure 4:
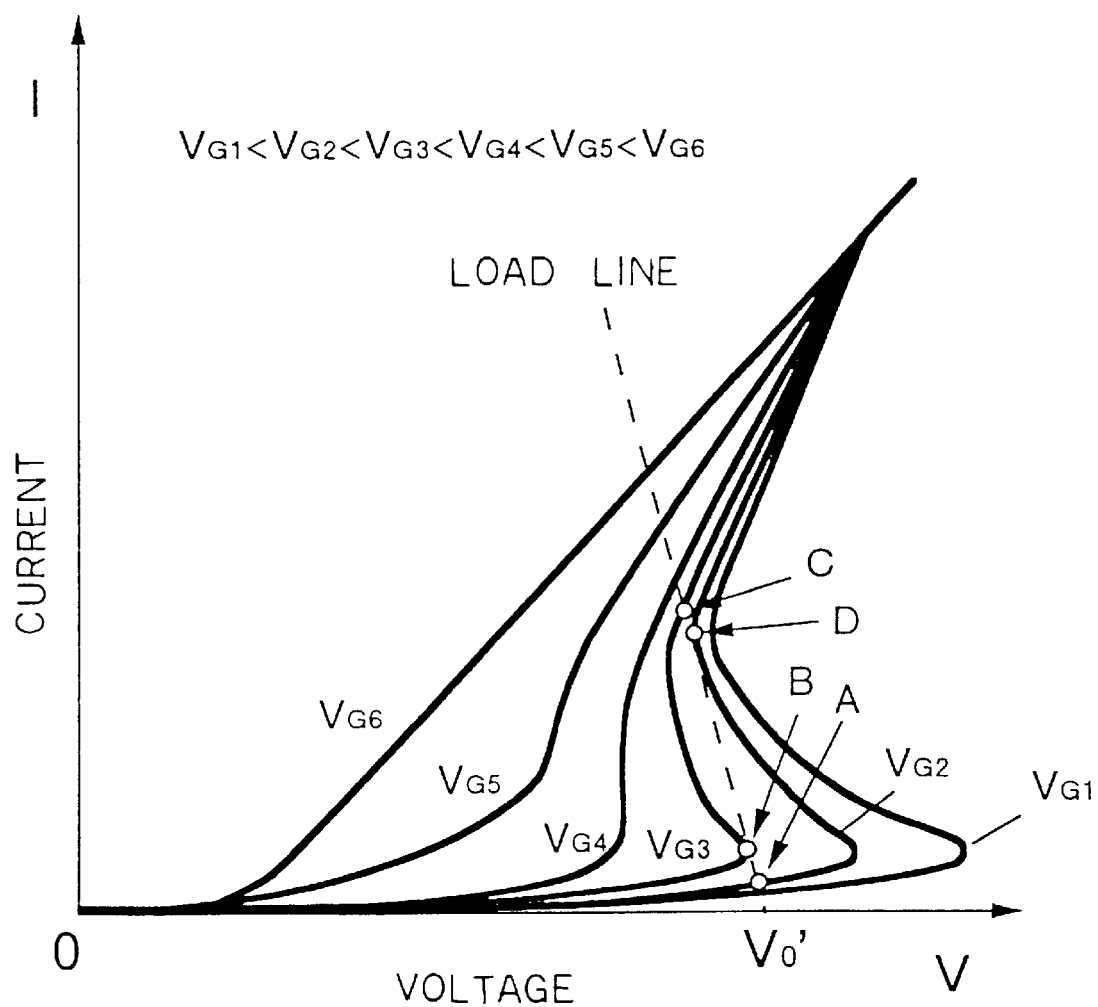
FIG. 4 illustrates voltage vs. current characteristics showing operations of the first embodiment of the present invention, corresponding to different gate voltages.
Figure 5:
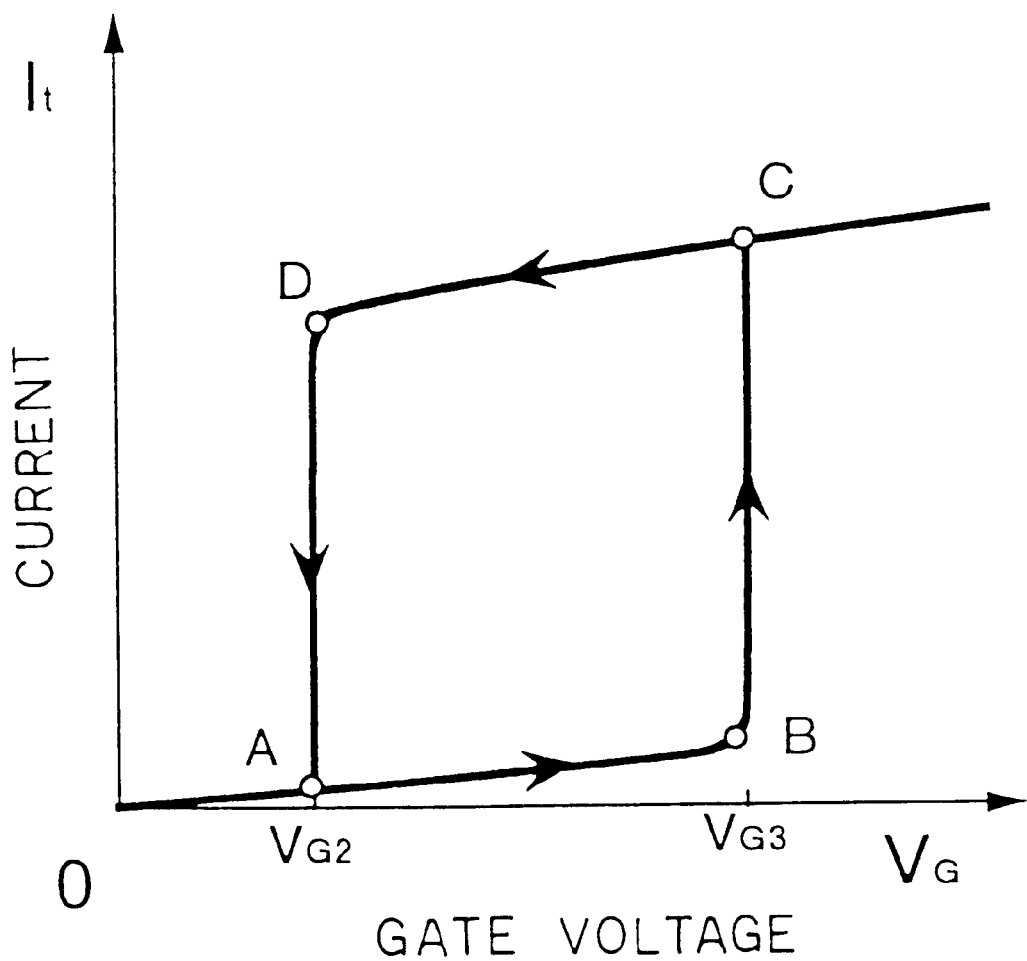
FIG. 5 is a gate voltage vs. current characteristic of the first embodiment of the present invention.
Figure 6:
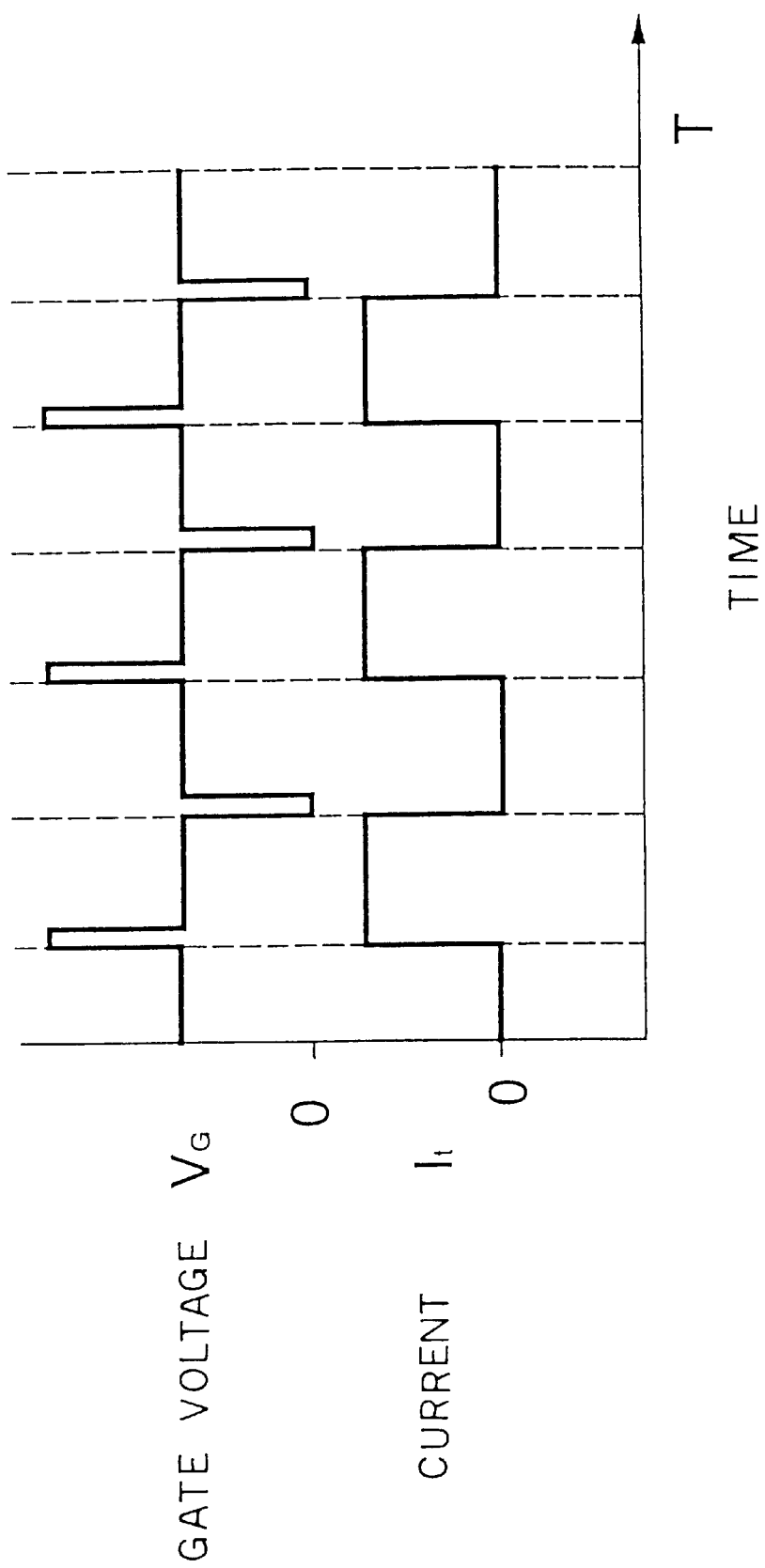
FIG. 6 is a memory characteristic of the first embodiment of the present invention.

A description will be given first of the basic function of each layer forming the element according to the present invention. In FIG. 2 there is depicted the band diagram of the element in a case where a positive bias voltage $V_0$ is applied to the n-InP layer corresponding to a drain layer and no voltage is applied to the gate layer 104. In this instance, electrons which are majority carriers in the source layer 106 cannot move through an energy barrier $\Delta LEc$; hence, a current $I_t$ does not flow. FIG. 3 shows a case where a positive gate voltage $V_G$ is applied to the gate layer 104. As the gate voltage $V_G$ is increased, the energy barrier $\Delta Ec$ decreases in height; consequently, the electrons which are majority carriers in the source layer 106 go over the barrier so that the current $I_t$ flows accordingly. At this time, in the device of the present invention, the electrons having passed through the gate layer 104 causes an electron avalanche in the i-InGaAlAs or i-InGaAsP layer 103, generating holes. The holes thus generated move to the gate layer 104 and are stored therein, lowering the potential of the gate layer 104 and hence decreasing the energy barrier $\Delta Ec$. This allows more electrons to move through the barrier, causing an electron avalanche and generating holes. In this way, a positive feedback occurs and the current increases rapidly, with a result that a negative resistance is provided. Conversely, when the gate voltage $V_G$ is decreased, the energy barrier $\Delta Ec$ increases, then the number of majority carriers decreases and the electron avalanche diminishes accordingly; hence, the potential of the gate layer 104 increases, causing a further increase in the height of the energy barrier $\Delta Ec$. As a result of this positive feedback, the current decreases rapidly. In FIG. 4 there are shown current-voltage characteristics representing operations of the device. The solid lines indicate the characteristics corresponding to various gate voltages and the broken line is a load line. In FIG. 4, reference character $V_0'$ denotes a bias voltage and $V_{G1}$ to $V_{G6}$ gate voltages. When the gate voltage is increased from $V_{G2}$ to $V_{G3}'$ the intersection moves from A to B and then to C. In FIG. 5 there is shown a current-gate voltage characteristic. By selectively increasing and decreasing the gate voltage, a bistable characteristic develops in the current as shown. FIG. 6 depicts a memory characteristic which is obtained with the bistable characteristic. Set and reset pulses of the gate voltage $V_G$ provides such a memory characteristic in the current $I_r$.

Figure 7:
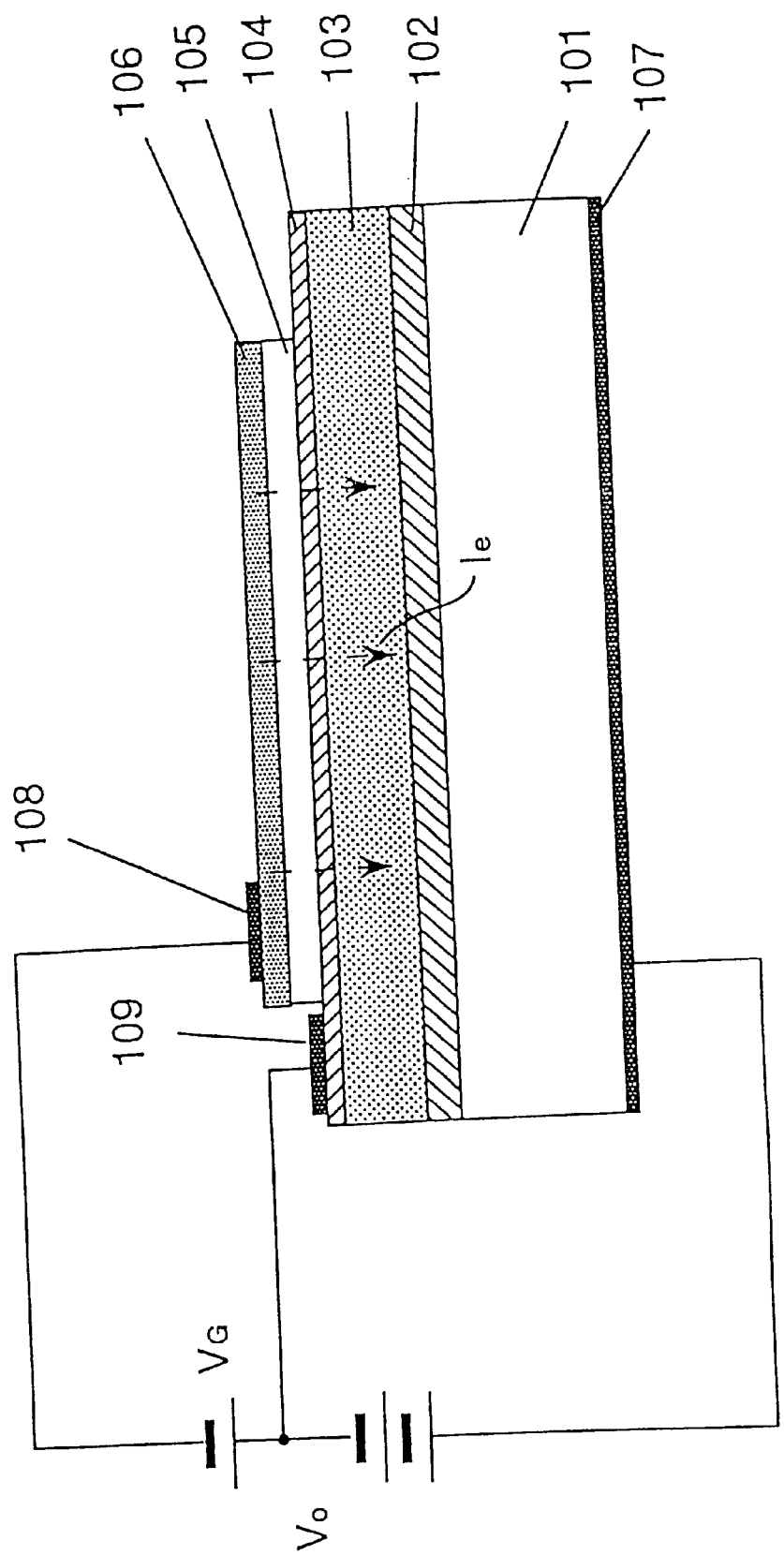
FIG. 7 is a longitudinal-section illustrating the first embodiment of the present invention.

FIG. 7 illustrates a first embodiment of the invention applied to an actual device structure. Reference numerals 107, 108 and 109 denote electrodes. An electron current $I_e$ is modulated by the gate voltage which is fed to the electrode 109.

[Embodiment 2]

Figure 8:
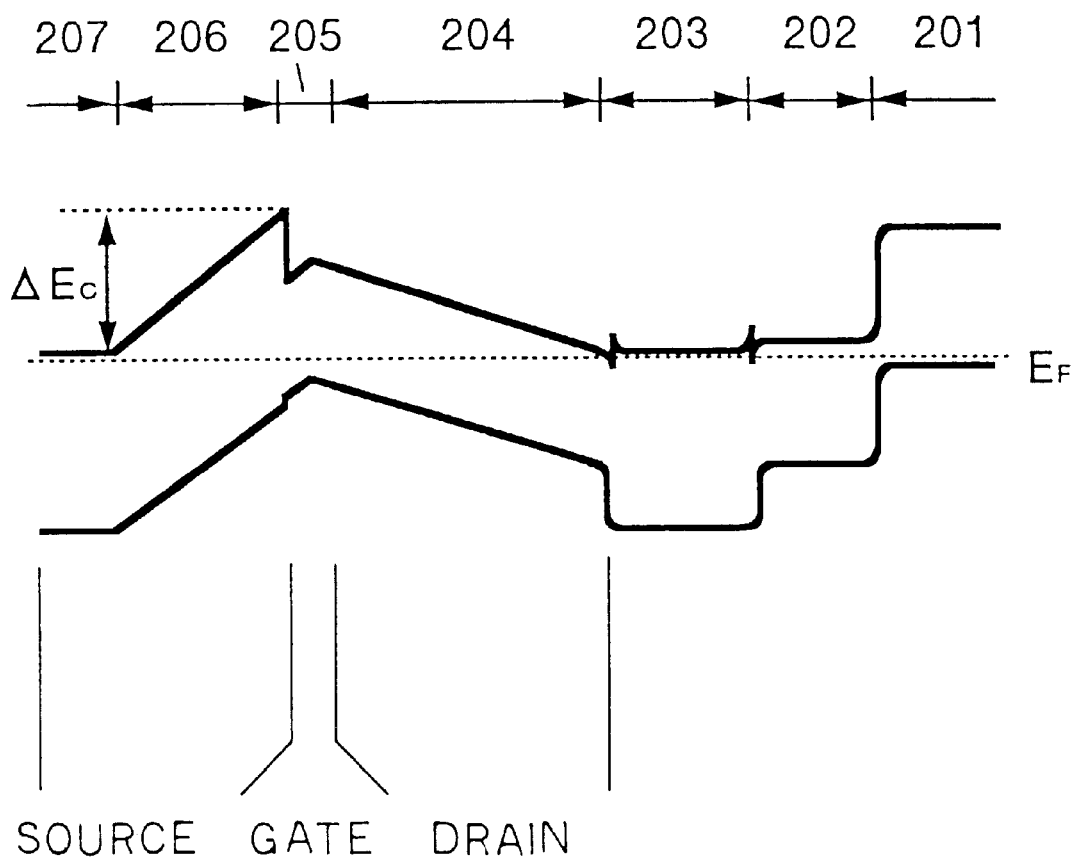
FIG. 8 is a band diagram of a second embodiment of the functional semiconductor element of the present invention in a thermal equilibrium condition.

Now, a description will be given of the functional operation of an optical device formed of the InGaAsP/InGaAlAs-series semiconductors for operation in the 1 μm wavelength range. FIG. 8 is a band diagram of the functional semiconductor element of the present invention when it is not in a biased condition. Reference numeral 201 denotes a p-InP layer used as a substrate, 202 an InGaAsP active layer (an energy gap wavelength λg~1.55 μm, and about 0.5 μm thick) which has a PN junction in one of its interfaces and is capable of emitting light or modulating the light transmittance by the carrier injection thereinto, 203 an n-InP layer (about 1 to 2 μm thick), 204 an i-InGaAs or i-InGaAsP light absorbing layer (λg~1.65 μm and about 1 to 2 μm thick) which is capable of generating electron carriers and hole carriers by absorbing incident light of a particular wavelength, 205 a p-InGaAs or p-InGaAsP layer (about 6 nm thick), 206 an i-InGaAlAs or i-InP layer (about 50 to 200 nm thick), and 207 an n-InGaAlAs or n-InP layer (about 0.1 to 0.5 μm thick). The broken line indicates the Fermi level. This embodiment will be described to have the light absorbing layer inside the triangular barrier diode (TBD) structure and the light emitting or light modulating layer outside thereof.

A description will be given first of the basic function of each constituent layer of this embodiment. Normally, a forward bias $V_0$ is applied across the element to such an extent that the entire element structure is moderately biased to compensate for at least the energy gap of the PN junction in the interface of the active layer 202 as shown in FIG. 9. The active layer 202 is designed so that it emits light or modulates the light transmittance therethrough of a signal light when a current is injected thereinto; thus, the light from this layer is taken out as output light. In the absence of input light, that is, when $P_i$=0, since no additional bias is applied to the p-InGaAs or p-InGaAsP layer 205 yet, the energy difference ΔEc is is still large. Thus, the current $I_r$ flowing through the element is substantially zero, and consequently, no current is injected into the active layer 202; hence, the layer does not emit light and its light transmittance is also extremely low.

Figure 10:
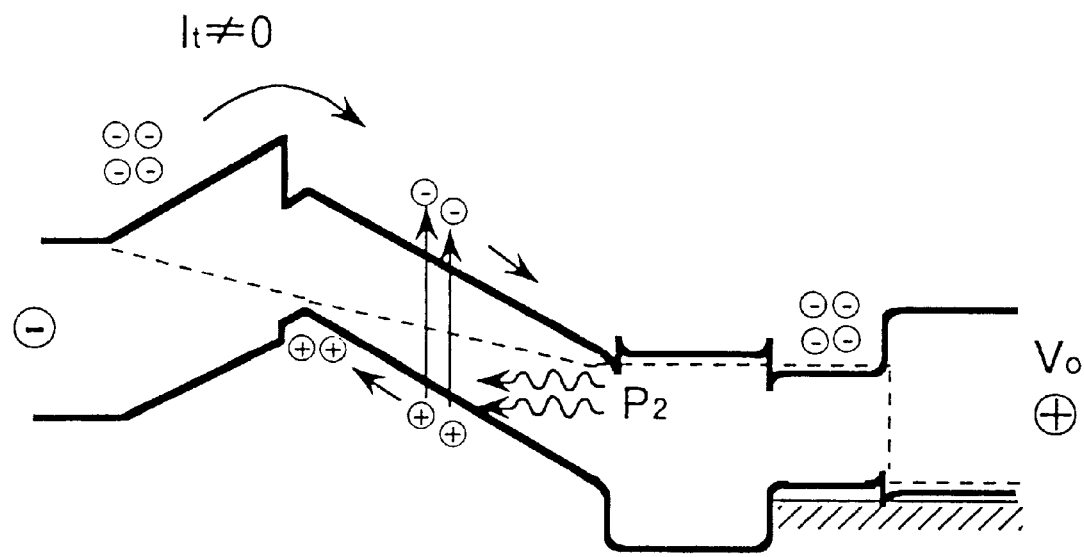
FIG. 10 is a band diagram of the second embodiment of the present invention with input-light power $P_2$ thereon.

Next, when the element is irradiated with light of a wavelength 1.57 μm and a power $P_1$ from the outside, the light is absorbed by the light absorbing layer 204 as depicted in FIG. 10. As a result of this, carriers are induced in the light absorbing layer 204; electrons are transported to the active layer 202 through the n-InP layer 203, whereas holes are transferred to the p-InGaAs or p-InGaAsP layer 205 of a low potential and trapped therein. Thus, the potential of the P-InGaAs or p-InGaAsP layer 205 drops and the barrier ΔEc becomes lower, permitting electrons to move through the barrier from the n-InGaAlAs or n-InP layer 207 to the right-hand side. At this time, in the device of the present invention, in order to cause an electron avalanche in the i-InGaAs or i-InGaAsP light absorbing layer 204, the electrons having flowed over the gate layer 205 brings about an electron avalanche, generating holes. The holes thus generated flow to the gate layer 205 and stay therein, further reducing the energy barrier ΔEc of the gate layer 205. This allows more electrons to go over the barrier, causing an electron avalanche and generating holes. Such a positive feedback and a resulting rapid increase in current give rise to a negative resistance. Consequently, a current is injected into the active layer 202; it emits light or its light transmittance increases. In this instance, since the gate layer 205 is thin, the holes stored in the gate layer 205 can move therethrough at a high speed. Conversely, when the light intensity is decreased, the number of holes that are generated decreases and the energy barrier ΔEc increases. Then, the number of majority carriers decreases and the electron avalanche diminishes accordingly; hence, the potential of the gate layer 205 increases, causing a further increase in the height of the energy barrier ΔEc. As a result of such a positive feedback, the current decreases rapidly; no current is injected into the active layer 202 and its light transmittance also decreases.

Figure 11:
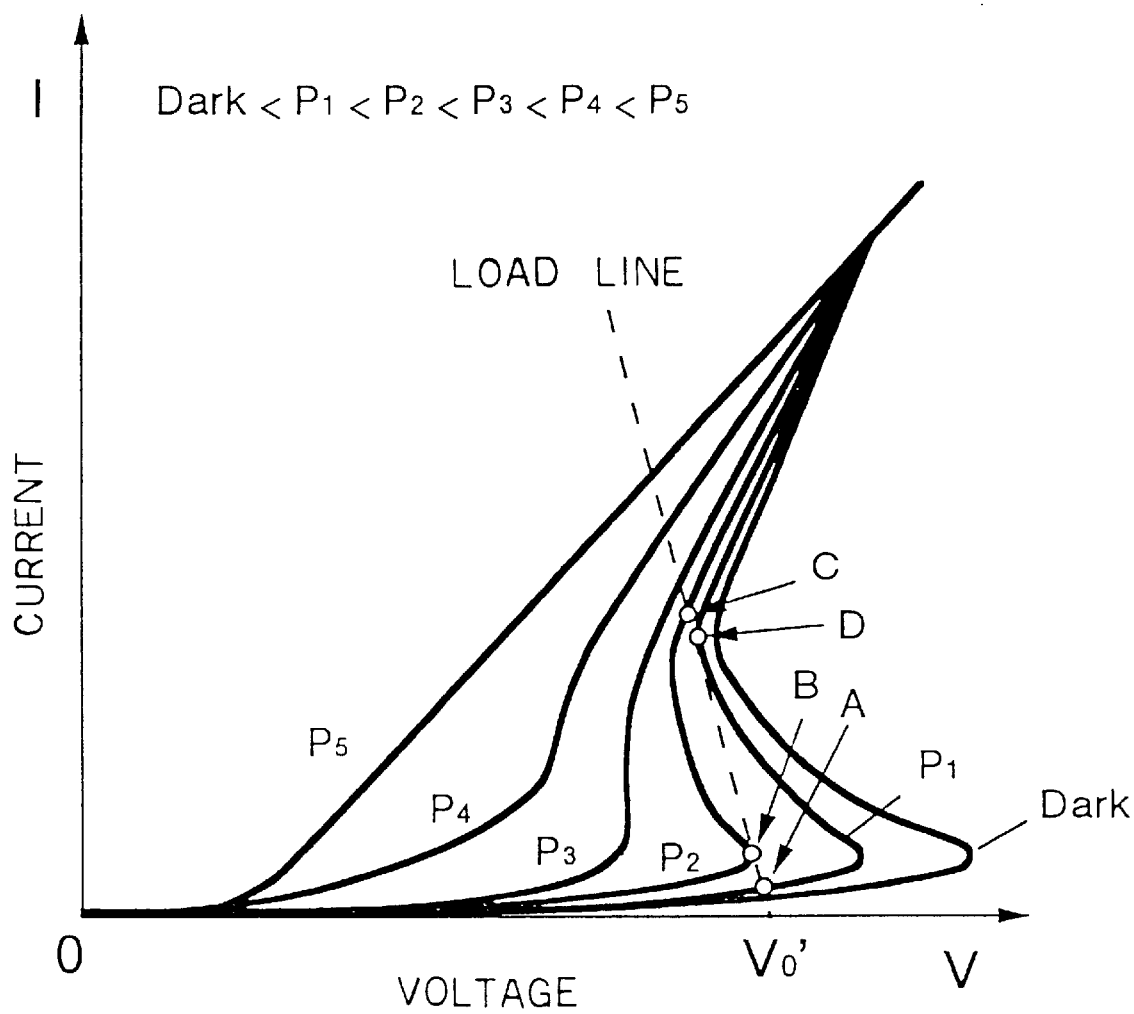
FIG. 11 illustrates voltage vs. current characteristics showing operations of the second embodiment of the present invention, corresponding to different light powers.
Figure 12:
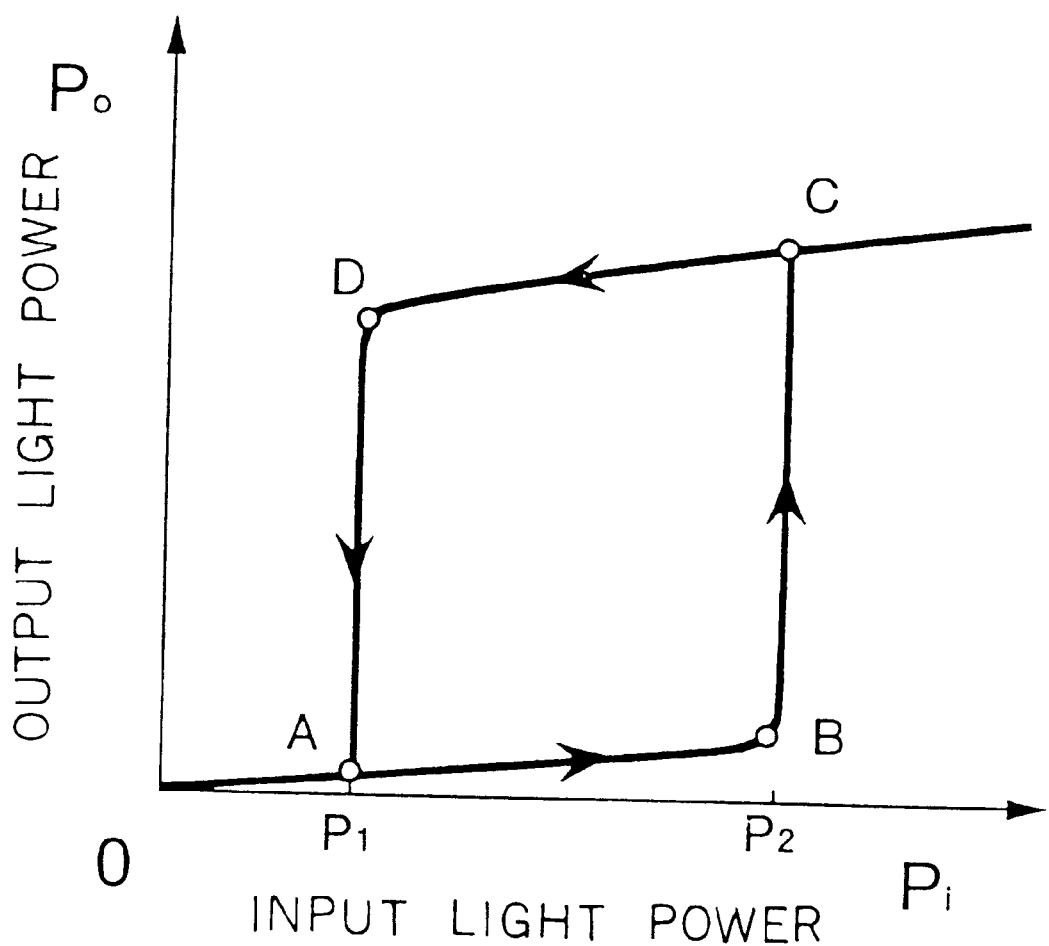
FIG. 12 is an output-light power vs. input-light power characteristic of the second embodiment of the present invention.
Figure 13:
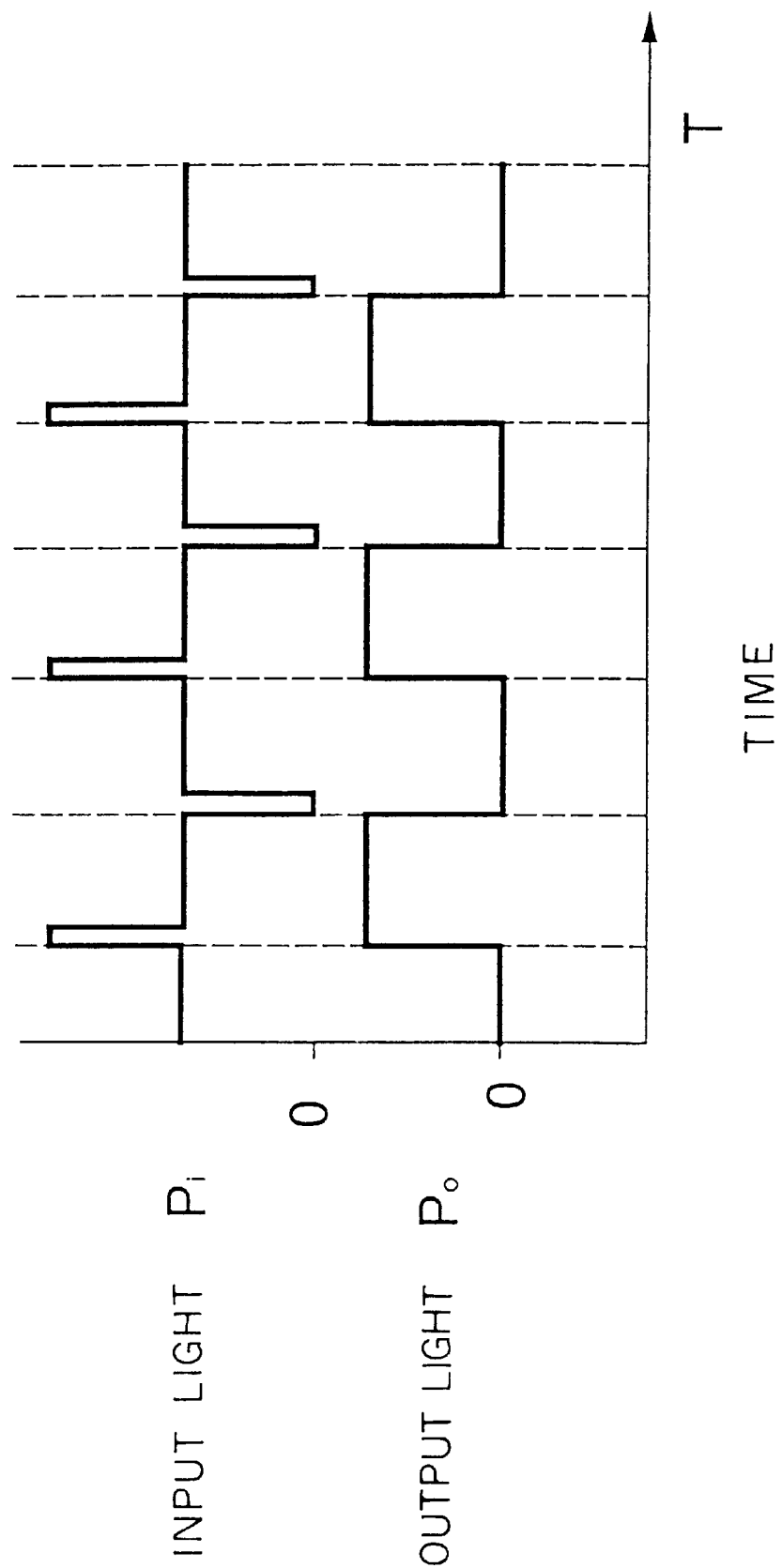
FIG. 13 is an optical memory characteristic of the second embodiment of the present invention.
Figure 14:
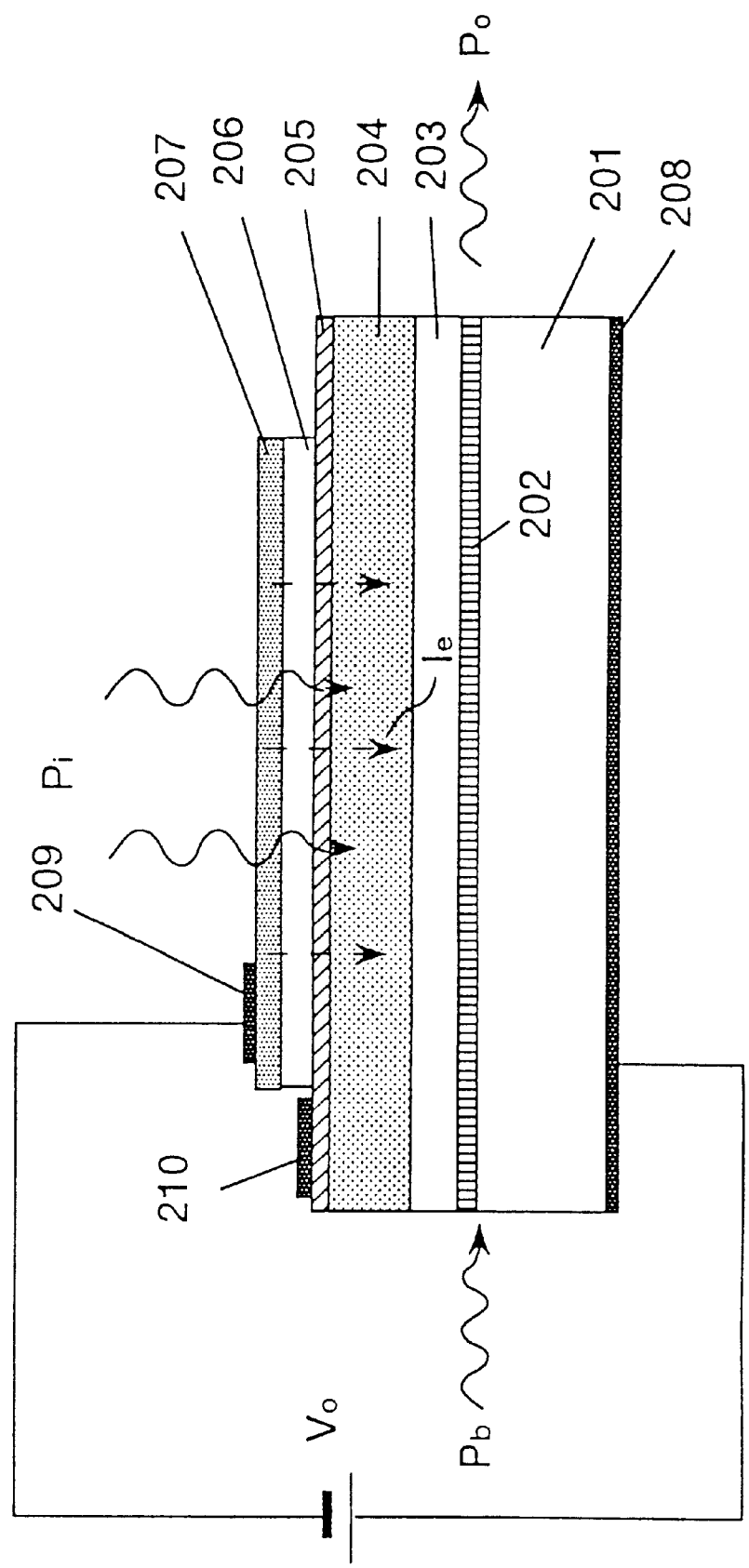
FIG. 14 is a longitudinal-section illustrating the second embodiment of the present invention.

In FIG. 11 there are shown current-voltage characteristics representing the operations of the device. The solid lines indicate characteristics corresponding to various input-light power and the broken line is a load line. In FIG. 11, reference character $V_0'$ denotes a voltage which is applied across the n-InP layer 203 and the n-InGaAlAs or n-InP 207 and $P_1$ to $P_4$ input-light power. When the input-light power is increased from $P_1$ to $P_2$, the intersection moves from A to B and then to C. When the input-light power is decreased from $P_2$ to $P_1$, the intersection moves from C to D and then to A. In FIG. 12 there is shown an output-light power vs. input-light power characteristic. By selectively increasing and decreasing the input-light power, a bistable characteristic can be obtained in the output-light power. FIG. 13 shows an optical memory characteristic which is obtained with the bistable characteristic of the output-light power. Set and reset pulses of the input light provide the memory characteristic in the output light. FIG. 14 illustrates a second embodiment of the present invention applied to an actual device structure. Reference numerals 208, 209 and 210 denote electrodes. The electron current $I_e$ is modulated by input light $P_i$. By providing, for example, a Fabry-Pérot resonator on one end face of the active layer 202 and properly setting its laser threshold value, the laser resonator including the active layer 202 can be caused to oscillate; hence, even in the absence of bias light $P_b$ to the waveguide, it is possible to generate laser output light $P_o$ modulated by the input light $P_i$. Incidentally, even if no laser resonator is provided on the one end face of the active layer 202, the device operates as an LED and emits similarly modulated output light $P_o$.

While in the above the input light $P_i$ has been described to be single, what is important is the total power of control light; the number of inputs does not matter. Next, the present invention will be described as being applied to a two-input optical logic element. Let it be assumed that two inputs $P_{i1}$ and $P_{i2}$ are coupled by a half mirror, coupler or the like into one input $P_i$. Here, setting $P_{i1}=P_{i2}=P_1$ and $P_{i1}+P_{i2}=P_2$ and using values obtained by normalizing respective light power with the input-light power $P_1$ which maximizes the output light $P_o$ shown in FIG. 14, the optical inputs bear such relationships as shown in Table 1 which is a truth table. That is, the element of the invention is able to function as an optical logic element which generates the output light $P_o$ following the logical product (AND) of the two optical inputs $P_{i1}$ and $P_{i2}$. By changing the input-light power, their logical sum (OR) can also be obtained. This is shown in Table 2.

TABLE 1

| $P_i$ | $P_{i1}/P_1$ | $P_{i2}/P_1$ | $P_o$ |
|---|---|---|---|
| 0 | 0 | 0 | 0 |
| $P_1$ | 1 | 0 | 0 |
| $P_1$ | 0 | 1 | 0 |
| $P_2$ | 1 | 1 | 1 |

TABLE 2

| $P_i$ | $P_{i1}/P_1$ | $P_{i2}/P_1$ | $P_o$ |
|---|---|---|---|
| 0 | 0 | 0 | 0 |
| $P_1$ | 1 | 0 | 1 |
| $P_1$ | 0 | 1 | 1 |
| $P_2$ | 1 | 1 | 1 |

Figure 15:
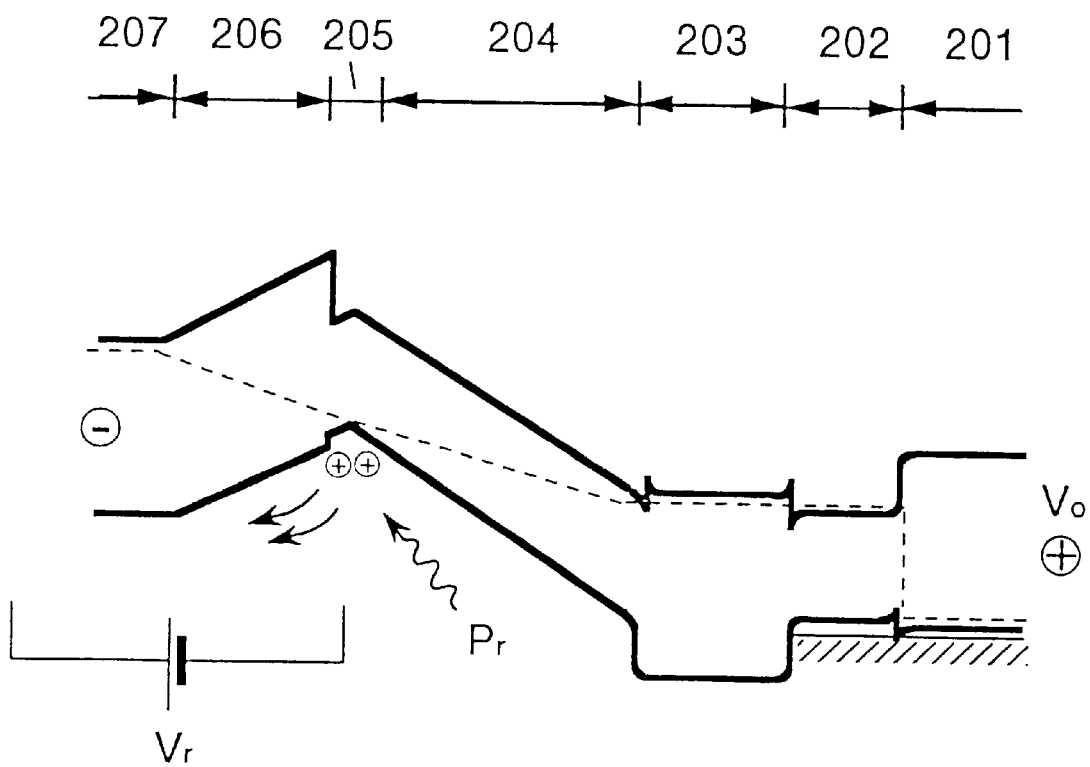
FIG. 15 is a band diagram of the second embodiment of the present invention under the application of a carrier rejecting bias voltage or the incident of light thereto.

The element of this embodiment has such a response characteristic that upon completion of the incidence thereon of light, the holes stored in the light absorbing layer 204 disappear spontaneously with as short a lifetime as several nanoseconds, permitting the next operation; further speeding up of the operation can be achieved by forcefully driving the holes out of the p-InGaAs or p-InGaAsP layer 205 through application thereto of a carrier rejecting bias voltage $V_r$ or through irradiation of the layer with light having a wavelength of 1.65 μm or more, as shown in FIG. 15. That is, in a case of the voltage application, the voltage $V_r$ needs only to be applied across the electrodes 209 and 210 in the embodiment of FIG. 14.

While this embodiment has been described to have the light absorbing layer inside of the triangular barrier diode (TBD) structure and the light emitting layer or light modulating layer outside thereof, the invention is not limited specifically thereto; namely, it is also possible to employ a construction which has the light absorbing layer outside of the triangular barrier (TBD) structure and the light emitting layer or light modulating layer inside thereof. When the output is taken out as a current or a voltage, the light emitting layer or light modulating layer may be omitted. Furthermore, although in the above the light absorption and the electron avalanche occur in the i-InGaAs or i-InGaAsP light absorbing layer 204, the invention is not limited specifically to such a configuration; the light absorbing layer may also be divided into layers of different compositions, that is, a light absorbing layer and an avalanche multiplying layer.

[Embodiment 3]

Figure 16:
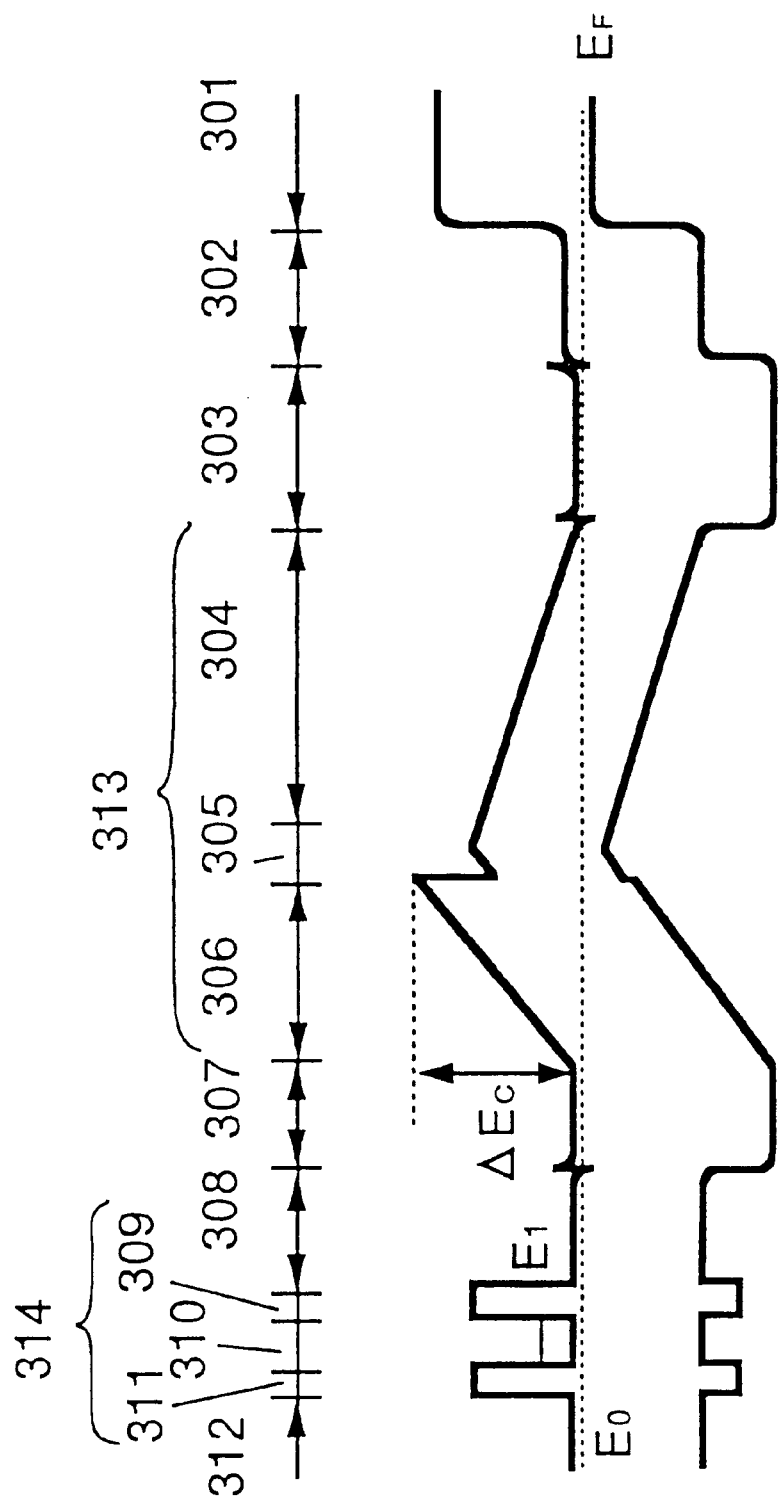
FIG. 16 is a band diagram of a third embodiment of the functional semiconductor element of the present invention in a thermal equilibrium condition.

FIG. 16 is a band diagram of a third embodiment of the optical functional semiconductor element of the present invention in its non-biased condition. This embodiment will be described to be formed of the InGaAsP/InGaAlAs-series semiconductors for operation in the 1 μm wavelength range. Reference numeral 301 denotes a p-InP layer, 302 an InGaAsP active layer (an energy gap wavelength $\lambda g$~1.55 μm and about 0.5 μm thick which has a PN junction in one of its interfaces and is capable of emitting light or modulating its light transmittance by the carrier injection thereinto, 303 an n-InP layer (about 1 to 2 μm thick), 304 an i-InGaAs or i-InGaAsP light absorbing layer ($\lambda g$~1.65 μm and about 1 to 2 μm thick) which is capable of generating electron carriers and hole carriers by absorbing incident light of a particular wavelength, 305 a p-InGaAs or p-InGaAsP layer (about 6 nm thick), 306 an i-InGaAlAs or i-InP layer (about 50 to 200 nm thick), 307 an n-InGaAlAs or n-InP layer, 308 an n-InGaAs layer, 309 an i-InAlAs or strained i-AlAs tunneling barrier layer (about 3 nm thick), 310 a strained InGaAs or strained InAs quantum well layer (about 7 nm thick), 311 an i-InAlAs or strained i-AlAs tunneling barrier layer (about 3 nm thick), and 312 an n-InGaAs layer. The layers 309, 310 and 311 constitute what is called a resonant tunneling diode (RTD) 314, and the layers 304, 305 and 306 constitute what is called a triangular barrier diode (TBD) 313; that is, the RTD 314 is provided outside the TBD 313. The broken line indicates the Fermi level. This embodiment will be described to have the light absorbing layer inside the triangular barrier diode (TBD) structure and the resonant tunneling diode (RTD) and the light emitting layer or light modulating layer outside it.

The operation of the RTD will be described first. Electrons in the conduction band of the n-InGaAs layer 312, which corresponds to an emitter layer, can be absorbed into the quantum well layer 310 by virtue of the tunneling effect, but since the electrons are multiple-reflected in the quantum well, the energy level that is allowed to pass through the layer is limited specifically to a discrete quantum energy level $E_1$. Hence, when the voltage across the RTD 314 is low, that is, when a positive voltage which is applied to the n-InGaAs layer 308 serving as the collector layer of the RTD is low, the quantum energy level $E_1$ is higher than the energy $E_0$ on the bottom of the conduction band where the electrons are allowed to stay in the emitter layer 312; therefore, substantially no electrons flow from the emitter layer 312. Now, as the voltage across the RTD 314 increases gradually, a difference between the energy levels $E_1$ and $E_0$ decreases, and consequently, electrons begin to flow. When the energy levels $E_0$ and $E_1$ become nearly equal to each other, the energy levels of the emitter layer 312 and the quantum well layer 310 coincide with each other; hence, electrons flow resonantly. As the applied voltage further increases, the energy level $E_0$ becomes higher than that $E_1$ and electrons are difficult of staying in the quantum well layer; hence, the electron current rather decreases.

Figure 18:
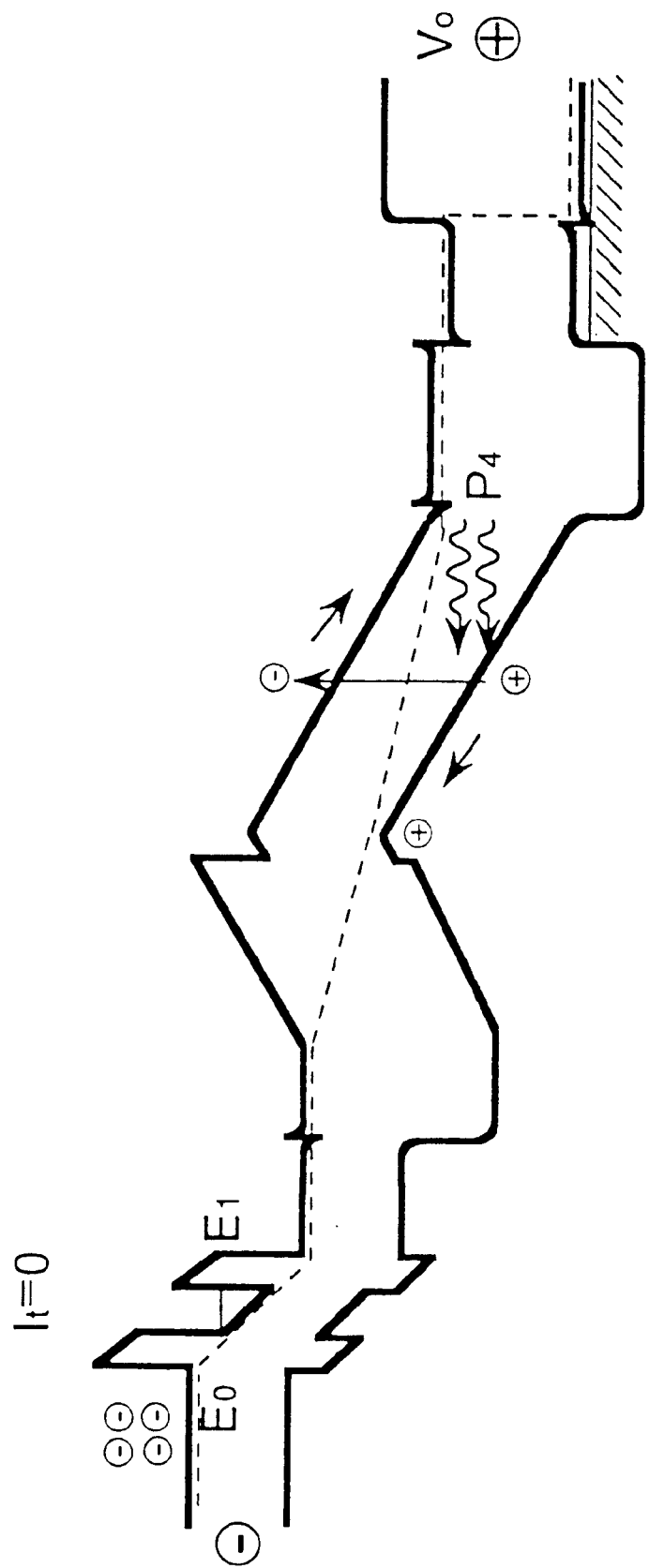
FIG. 18 is a band diagram of the third embodiment of the present invention with input-light power P4 thereon.

A description will be given of the function of each constituent layer of the element according to this embodiment. Normally, a forward bias voltage $V_0$ is applied across the element to such an extent that the entire element structure is moderately biased to compensate for at least the energy gap of the PN junction in the interface of the active layer 302. The active layer 302 is so designed as to emit light or modulate the light transmittance therethrough of an optical signal when a current is injected thereinto; thus, the light from this layer is taken out as output light. When the element is not irradiated with light, no current flows into the TBD as referred to previously in respect of Embodiment 2, but when the input-light power exceeds a certain value, current flows in the TBD owing to the avalanche multiplication, causing an increase in the output-light power. The bias voltage $V_0$ is chosen such that electrons resonantly flow in the RTD region. This is shown in FIG. 17. When the input-light power is $P_2$, the RTD resonates and the avalanche multiplication occurs in the TBD. As shown in FIG. 18, when the input-light power is further increased to $P_4$, the RTD stops resonating, and consequently, no current flows and the output light decreases.

Figure 19:
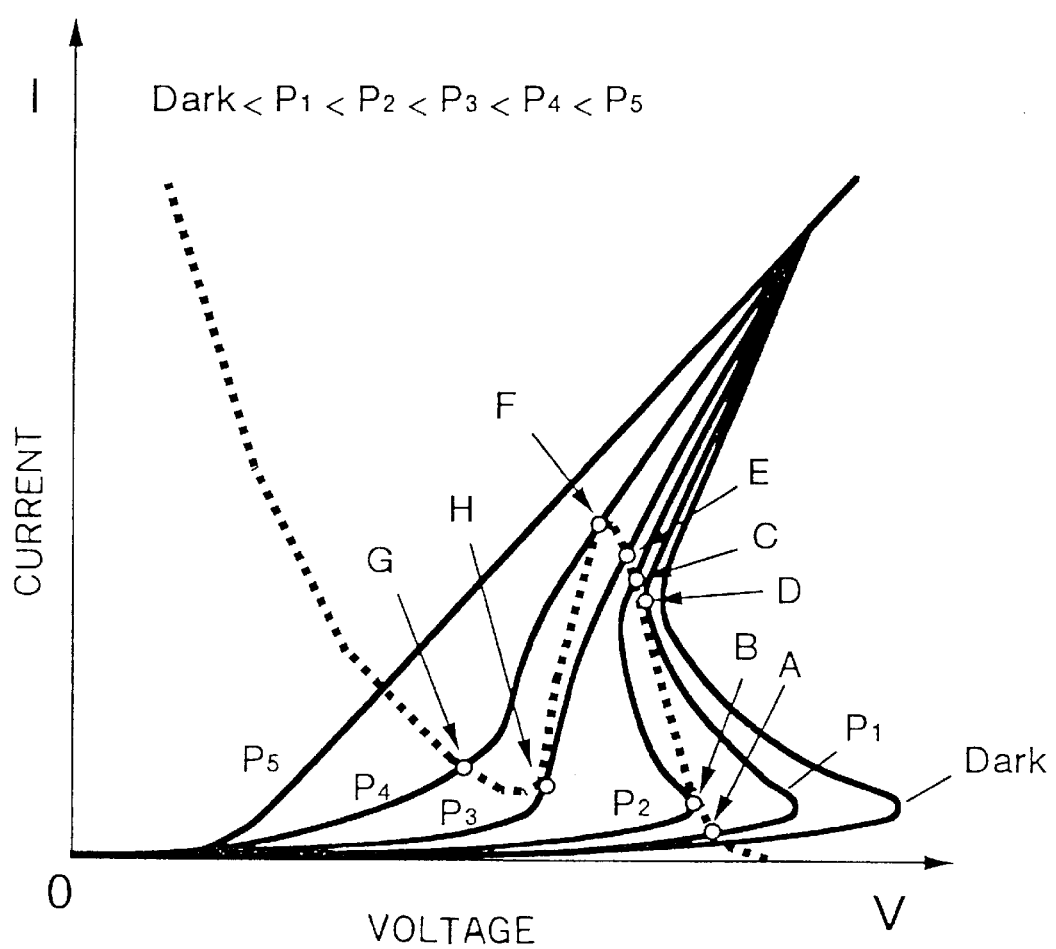
FIG. 19 illustrates voltage vs. current characteristics showing operations of the third embodiment when irradiated with light of different powers.
Figure 20:
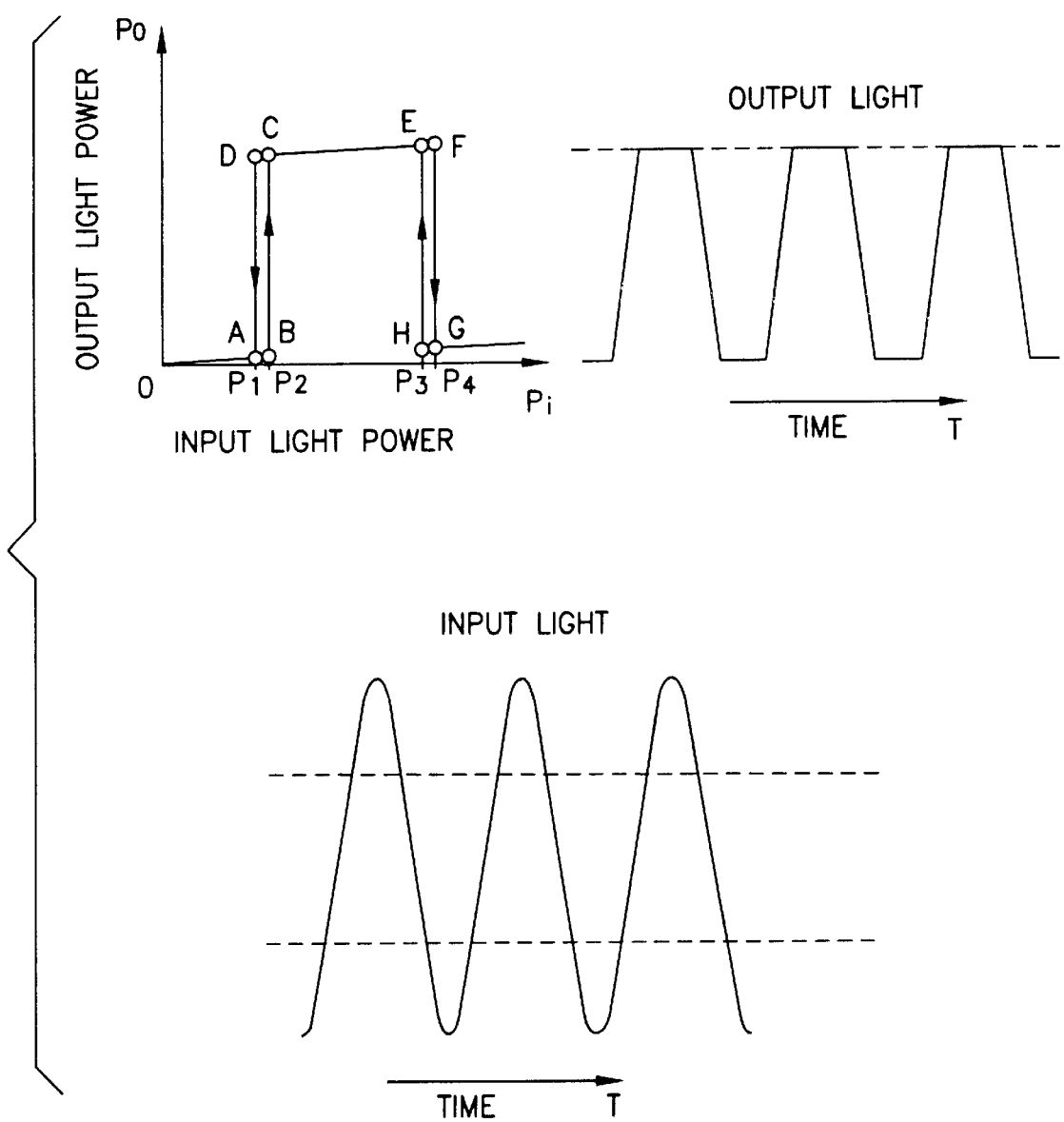
FIG. 20 is a limiter characteristic of the third embodiment of the present invention.

FIG. 19 shows the current-voltage characteristics representing operations of the element of this embodiment. The solid lines indicate characteristics of the TBD region corresponding to various input-light power and the broken line the characteristic of the resonant tunneling diode. Reference characters $P_1$ to $P_4$ denote the input-light power. When the input-light power increases from $P_1$ to $P_2$, the intersection moves from A to B and then to C. When the input-light power further increases from $P_3$ to $P_4$, the intersection moves from E to F and then to G. When the input-light power decreases from $P_4$ to $P_3$, the intersection moves from G to H and then to E. When the input-light power further decreases from $P_2$ to $P_1$, the intersection moves from C to D and then to A. In FIG. 20 there is shown the output-light power vs. input-light power characteristic of the element. This characteristic indicates that the element functions as a limiter which cuts the output-light power when the input-light power is larger or smaller than a predetermined value. For example, when a sinusoidal optical input is applied, its upper and lower portions are cut.

Figure 21:
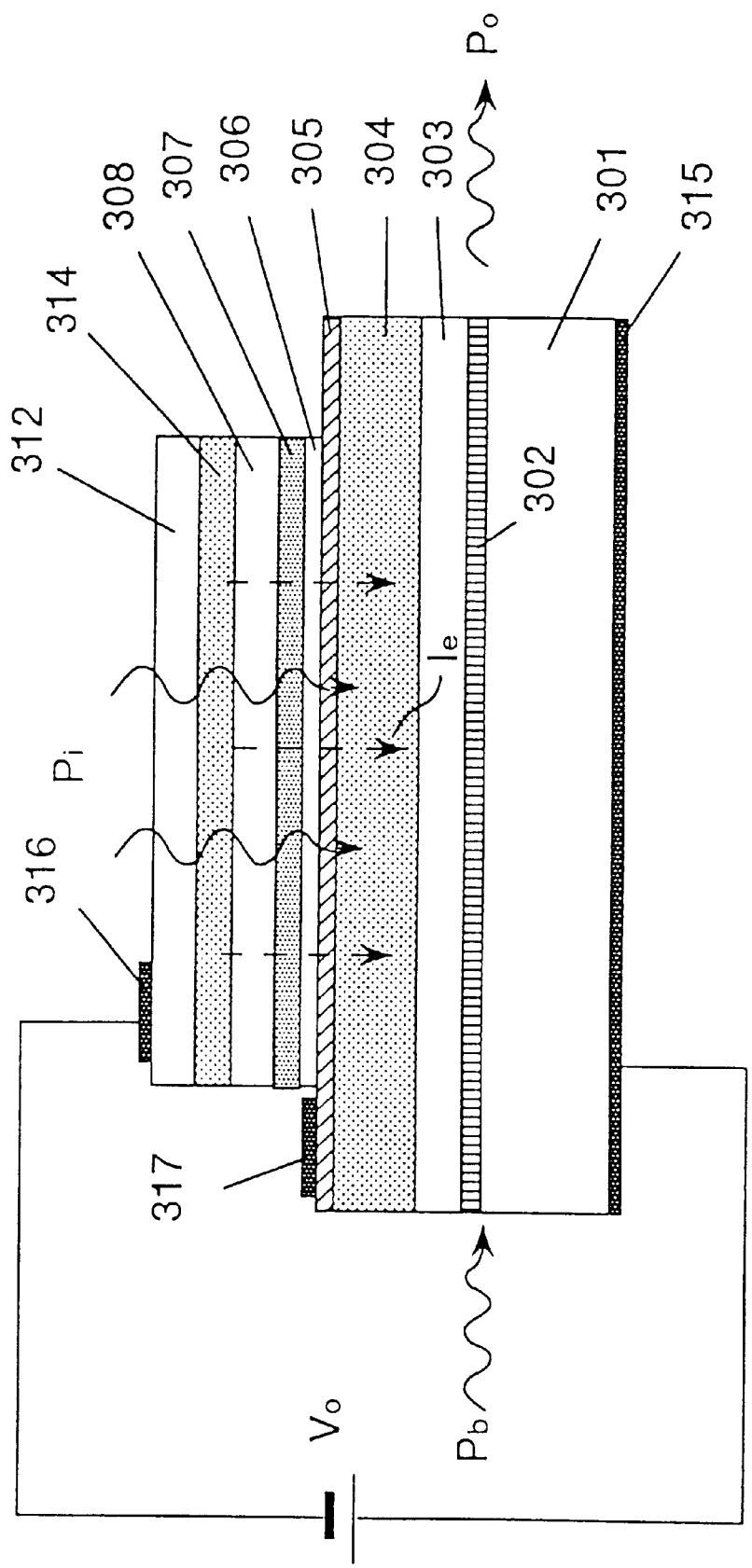
FIG. 21 is a longitudinal-section illustrating the third embodiment of the present invention.

FIG. 21 illustrates a third embodiment of the present invention applied to an actual element structure. Reference numerals 315, 316 and 317 denote electrodes. The electron current $I_e$ is modulated by the input light $P_1$.

While this embodiment has been described to include the light absorbing layer inside the triangular barrier diode (TBD) structure and the resonant tunneling diode (RTD) and the light emitting layer or light modulating layer outside it, the invention is not limited specifically thereto; for example, it is also possible to employ a configuration wherein the light absorbing layer is formed outside the triangular barrier diode (TBD) structure and the resonant tunneling diode (RTD) and the light emitting layer or light modulating layer inside it. Moreover, the TBD and the RTD have each been described to be single, but higher-performance operations can be implemented by forming each of them in layers. Although in the above the resonant tunneling diode is shown to have a single quantum well, the same functional operation as mentioned above could be obtained with a multi-quantum well type resonant tunneling diode having a plurality of quantum wells. When the output is provided as a current or a voltage, the light emitting layer or light modulating layer need not be provided. Besides, while in this embodiment the light absorption and the electron avalanche are described to occur in the i-InGaAs or i-InGaAsP light absorbing layer, the invention is not limited specifically to such a configuration; the light absorbing layer may also be divided into layers of different compositions such as a light absorbing layer and an avalanche multiplication layer.

[Embodiment 4]

Figure 22:
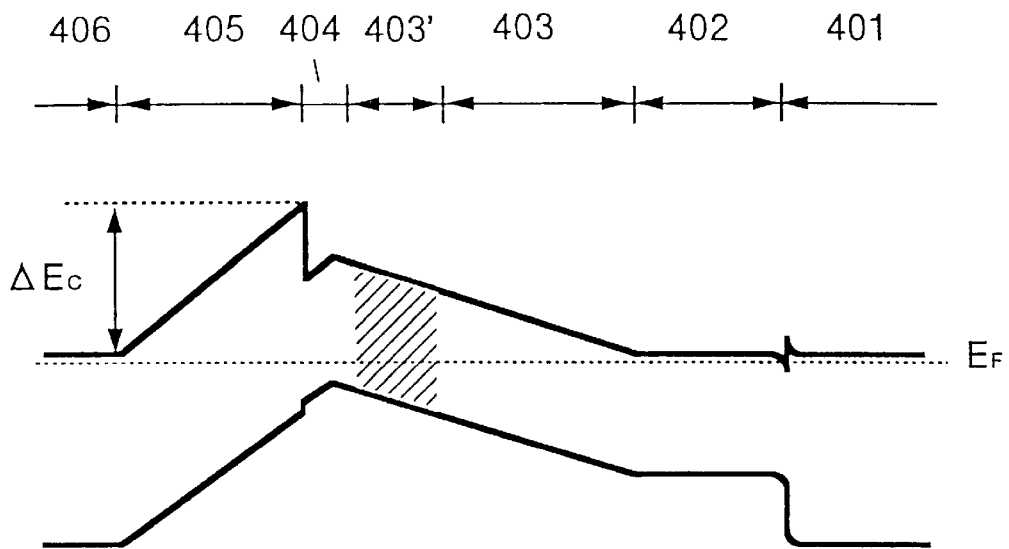
FIG. 22 is a band diagram of a fourth embodiment of the functional semiconductor element of the present invention in a thermal equilibrium condition.

Now, description will be given of the functional operation of an optical device formed of the InGaAsP/InGaAlAs-series semiconductors for operation in the 1 μm wavelength range. FIG. 22 is a band diagram of the functional semiconductor element of the present invention in its non-biased condition. Reference numeral 401 denotes an n-InP layer, 402 an n-InGaAlAs or n-InGaAsP layer (about 1 to 2 μm thick), 403 an i-InGaAs or i-InGaAsP light absorbing layer (λg~1.65 μm and about 1 μm thick), 403' an i-InGaAs or i-InGaAsP avalanche multiplication layer (λg ~1.65 μm and about 1 μm thick), and 404 a p-InGaAlAs or p-InGaAsP layer (about 6 nm thick) doped sufficiently to such an extent that electrons, which are majority carriers in the source layer, cannot move through the energy barrier ΔEc even if a bias voltage is applied to the element. Reference numeral 405 denotes an i-InGaAlAs or i-InP layer (about 50 to 200 nm thick) and 406 an n-InGaAlAs or n-InP layer (about 0.1 to 0.5 μm thick). The broken line indicates the Fermi level. This embodiment will be described to include the light absorbing layer in the triangular barrier diode (TBD) structure.

Figure 23:
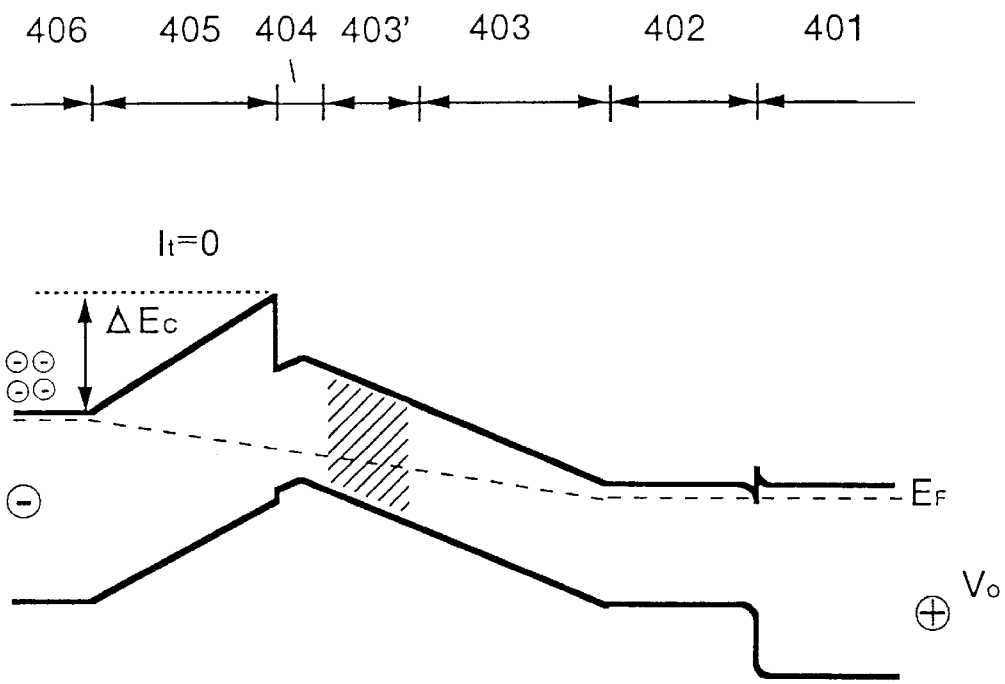
FIG. 23 is a band diagram of the fourth embodiment of the present invention with no light incident thereon.
Figure 24:
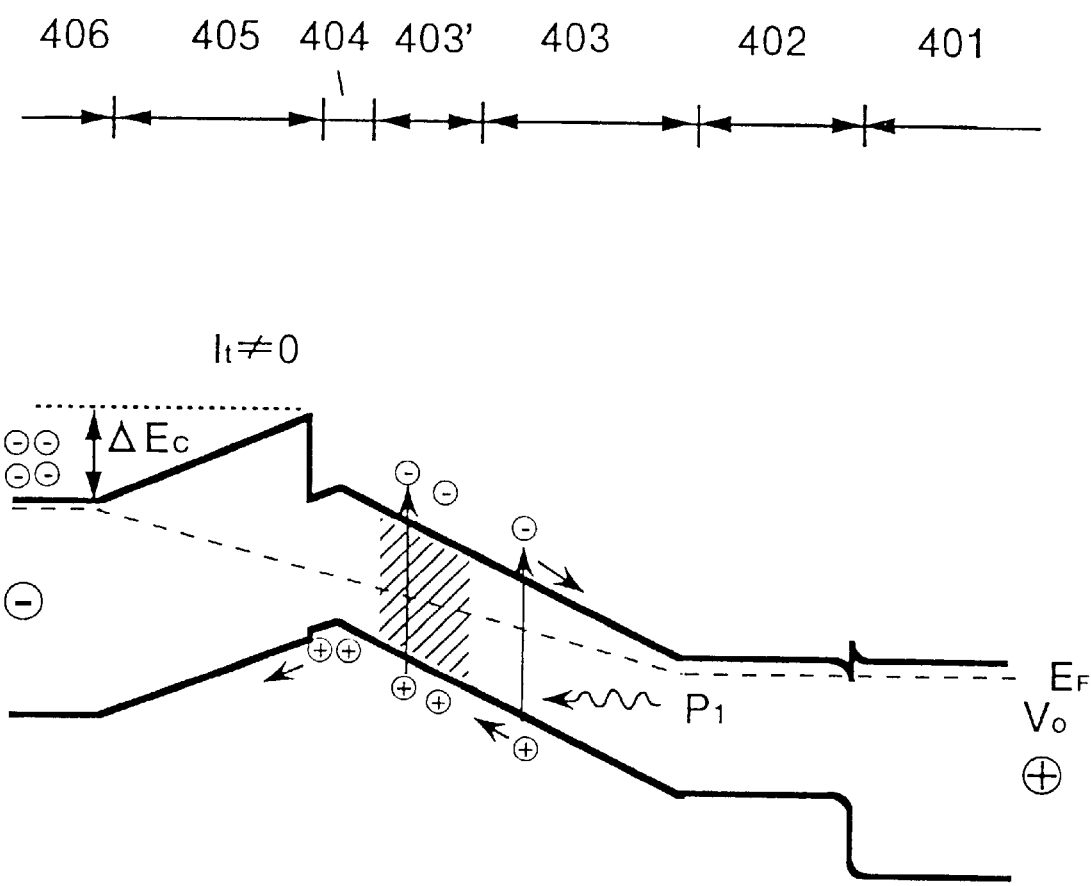
FIG. 24 is a band diagram of the fourth embodiment of the present invention with input-light power $P_1$ thereon.
Figure 25:
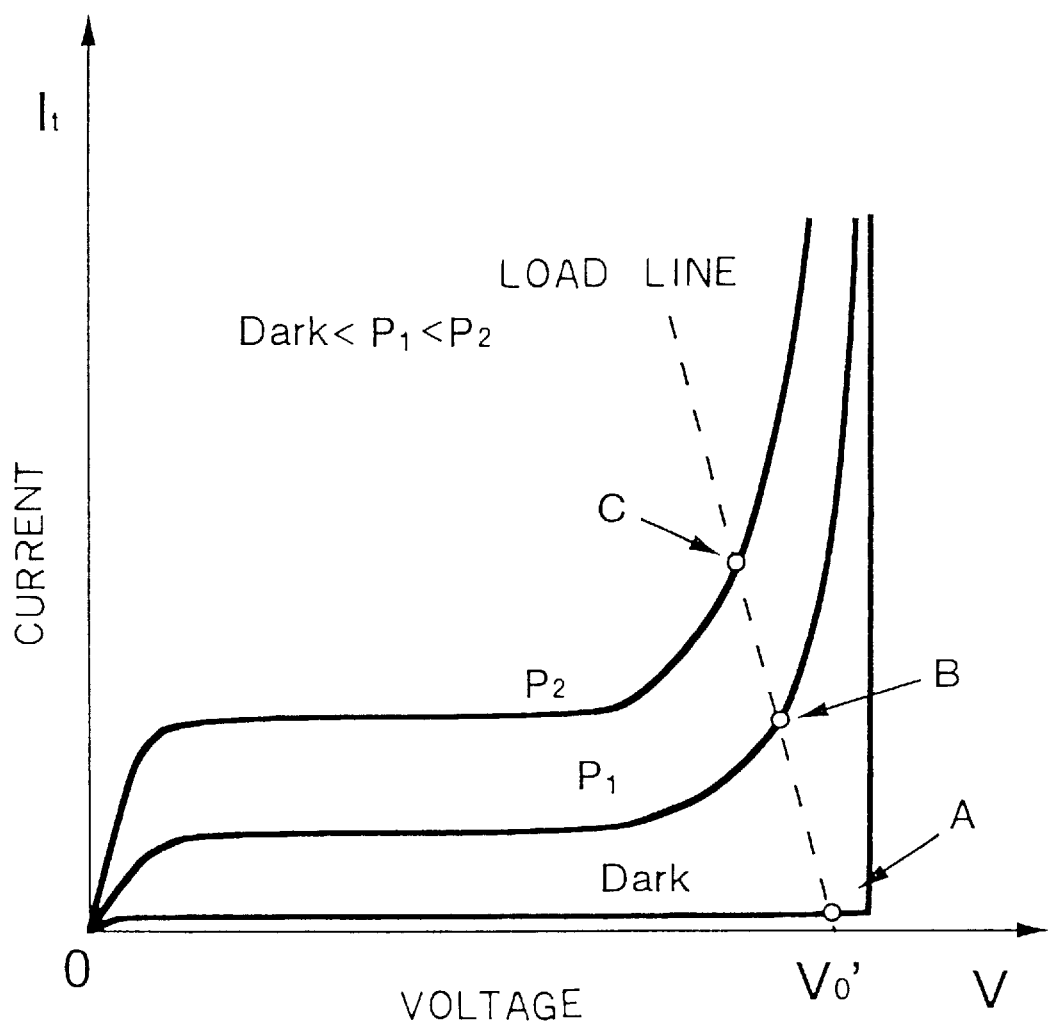
FIG. 25 shows voltage vs. current characteristics of the fourth embodiment of the present invention when irradiated with light of different powers.

A description will be given of the basic function of each constituent layer of this embodiment. In FIG. 23 there is shown a band diagram of the element according to this embodiment in a case where a positive bias voltage is applied to the n-InP layer serving as a drain layer and no light is incident on the element. In this instance, electrons which are majority carriers in the source layer 406 of a low potential. At this time, in the device of the present invention, the holes cause an avalanche multiplication in the avalanche multiplication layer 403', generating electrons therein. The electrons thus generated move to the n-InGaAlAs or n-InGaAsP layer 406. The holes stored in the gate layer 404 can rapidly move therethrough toward the n-InGaAlAs or n-InP layer 406, since the gate layer 404 is thin. In FIG. 25 there is depicted the load characteristic of the device for various input-light power in a case where the voltage applied across the n-InP layer 401 and the n-InGaAlAs or n-InP layer 406 is set to $V_0'$. As the input-light power increases, the intersection moves from A to B and then to C.

Figure 26:
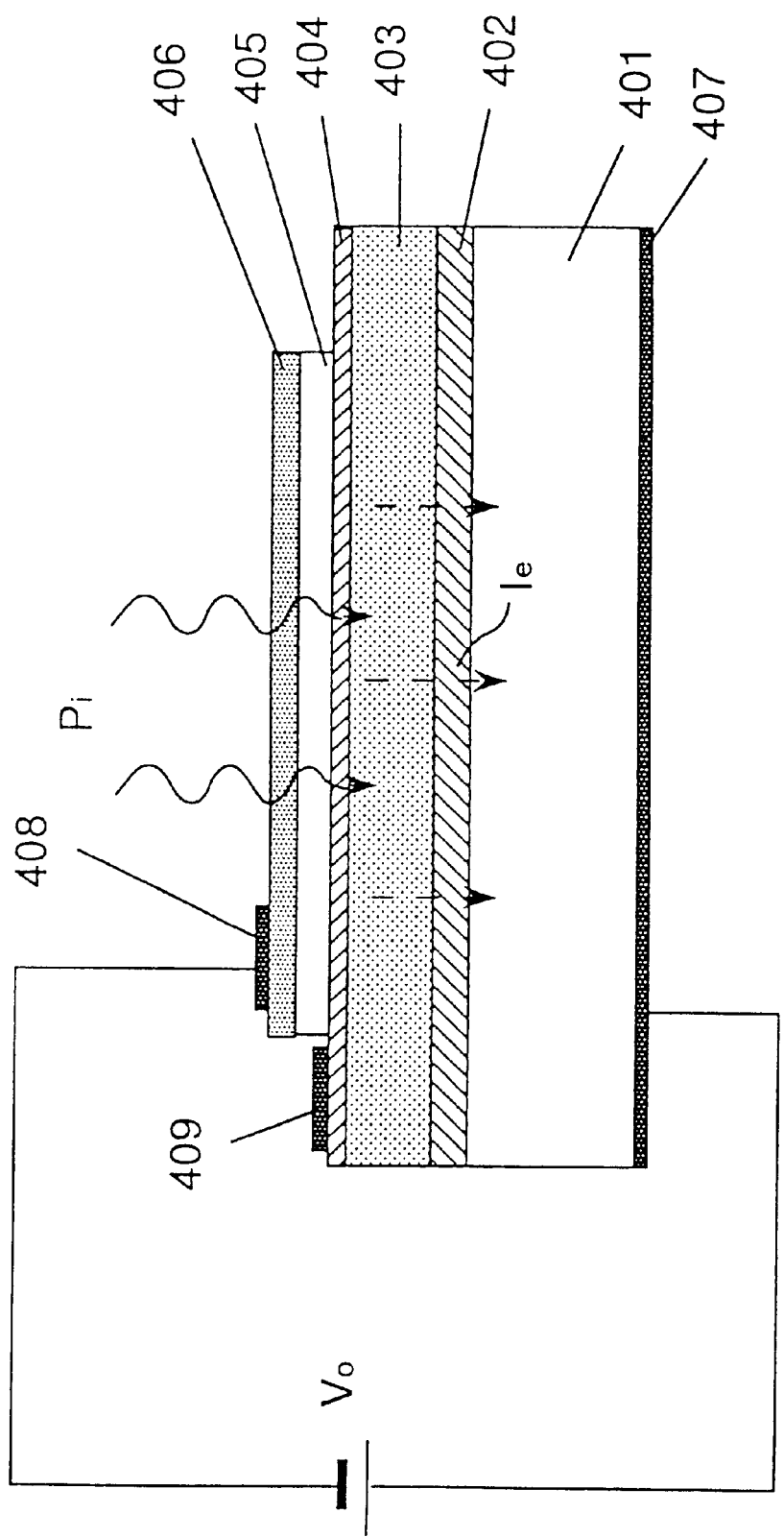
FIG. 26 is a longitudinal-sectional view illustrating the fourth embodiment of the present invention.

FIG. 26 illustrates a fourth embodiment of the present invention applied to an actual device structure. Reference numerals 407, 408 and 409 denote electrodes. The electron current $I_e$ is modulated by input light $P_i$.

As described above, the device of this embodiment can be used as an avalanche photodiode which utilizes the avalanche multiplication. Conventional avalanche photodiodes require a high voltage for generating therein a high-intensity electric field, but the device structure of this embodiment is capable of generating a high-intensity electric field with a low voltage, and hence is easy to handle. While in this embodiment the light absorbing layer 403 and the avalanche multiplication layer 403' are identical in composition, they may also be formed with different compositions. This embodiment employs the n-i-p-i-n structure for preventing the majority carriers from flowing over the energy barrier; the purpose could also be served by p-i-n-i-p, n-i-p-i-p, n-i-n-i-p, n-i-n-i-n, p-i-n-i-n, p-i-p-i-p and p-i-p-i-n structures. Although this embodiment has been described to include the light absorbing layer in the triangular barrier diode (TBD) structure, it is also possible to provide the light absorbing layer outside the triangular barrier diode (TBD) structure.

[Embodiment 5]

Figure 27:
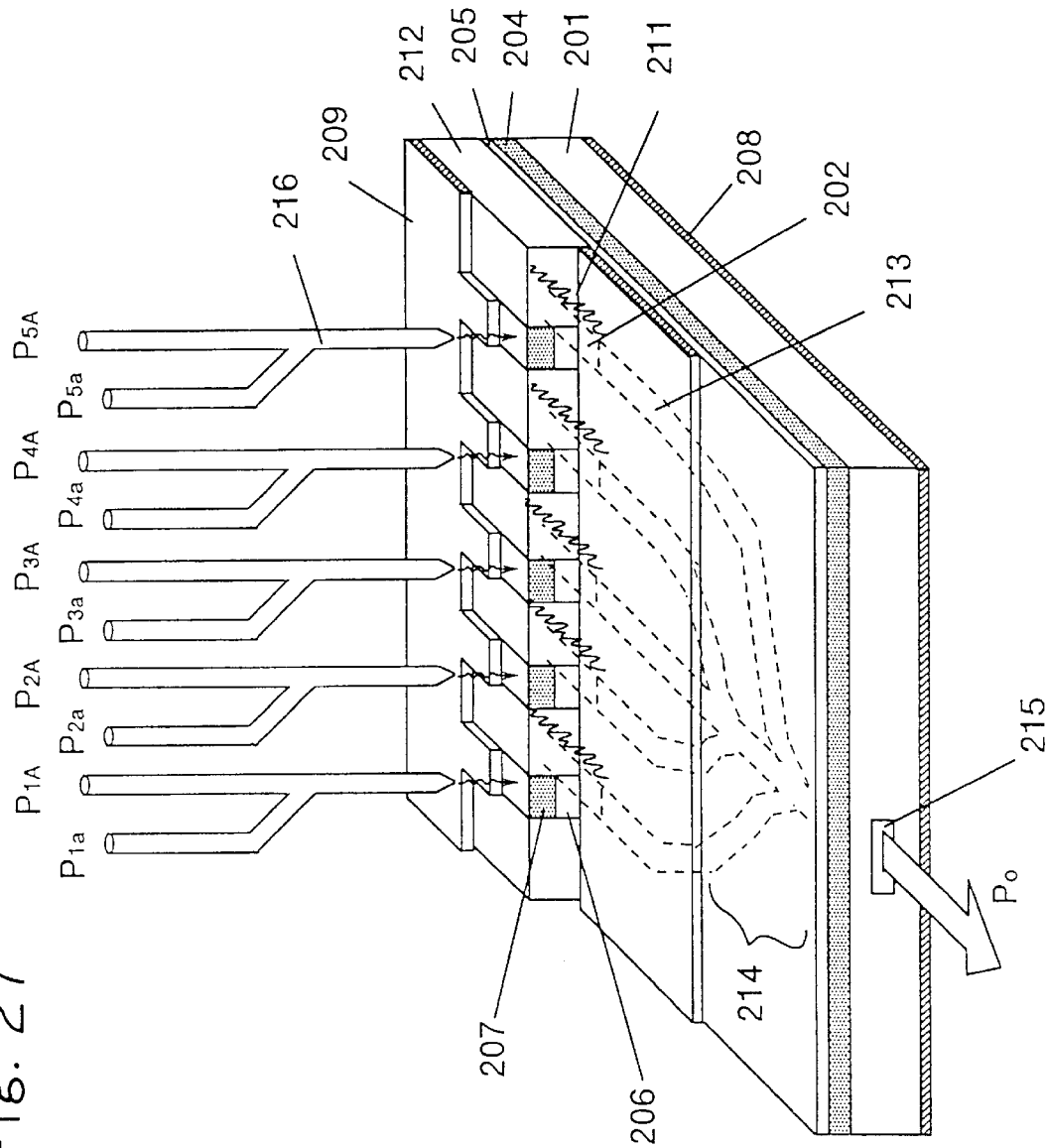
FIG. 27 is an embodiment of the functional semiconductor element of the present invention shown as being applied to an optical logic operation element.

FIG. 27 illustrates another embodiment of the present invention which employs a plurality of optical functional elements of the second embodiment and is used as a logical operation element. This embodiment will be described as being formed of the InGaAsP/InGaAlAs-series semiconductors for operation in the 1 μm wavelength range. Reference numeral 201 denotes a p-InP layer, 202 an InGaAsP active layer (the energy gap λg~1.55 μm and about 0.5 μm thick) which has a PN junction in one of its interfaces and is capable of emitting light or modulating the light transmittance therethrough by the carrier injection thereinto, 203 an n-InP layer (about 1 to 2 μm thick), 204 an i-InGaAs or i-InGaAsP light absorbing layer (λg~1.65 μm and about 1 to 2 μm thick) which is capable of generating electron carriers and hole carriers by absorbing incident light of a particular wavelength, 205 a p-InGaAlAs or p-InGaAsP layer (about 6 nm thick), 206 an i-InGaAlAs or i-InP layer (about 50 to 200 nm thick), 207 an n-InGaAlAs or n-InP layer (about 100 to 300 nm thick), and 211 a λA/4 shift diffraction grating which is provided along the active layer 202 to form a DFB laser structure. Reference numeral 212 denotes an InP buried layer, 213 an InGaAsP output waveguide layer, 214 an optical multiplexer, 215 an output end face, 216 fibers for light irradiation use, and 208, 209 and 210 electrodes. This embodiment will be described as an AND element which has five elements integrated on the same substrate and ANDs bit patterns of two five-bit optical pulse trains.

Figure 28:
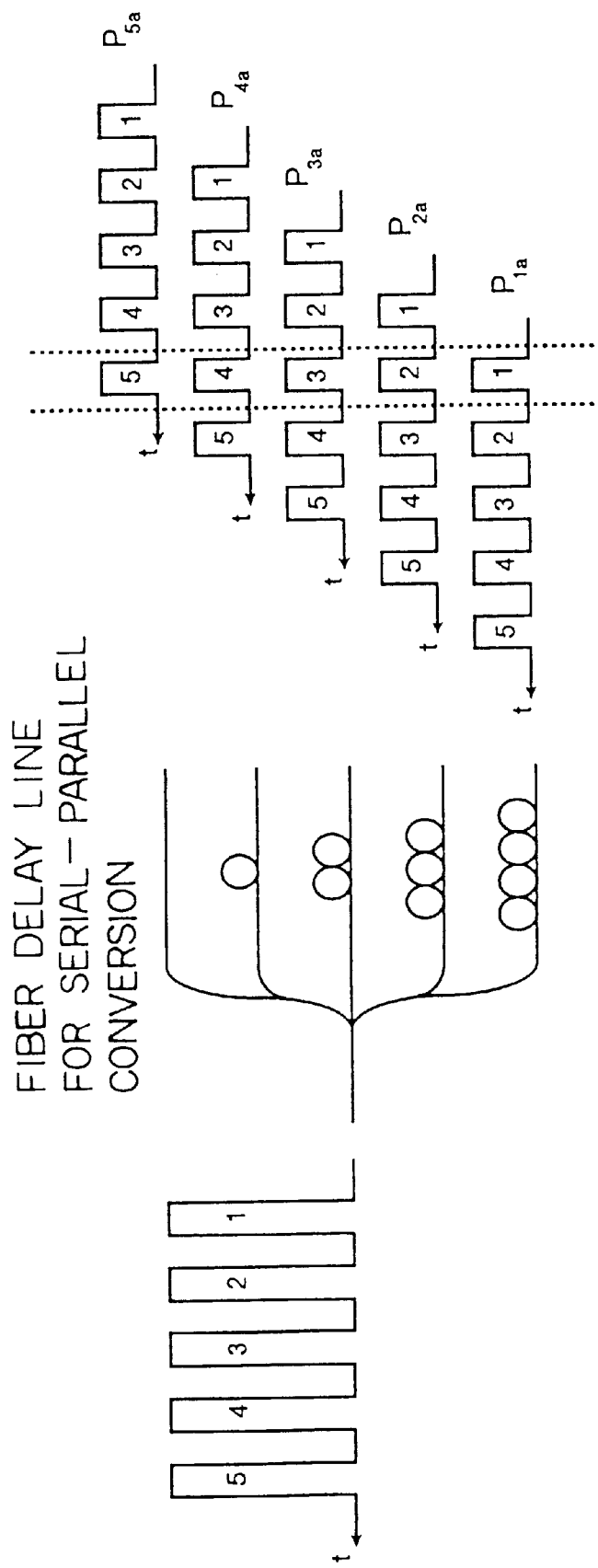
FIG. 28 is a diagram showing an example of a serial-parallel converter for use in the embodiment of FIG. 27.
Figure 29:
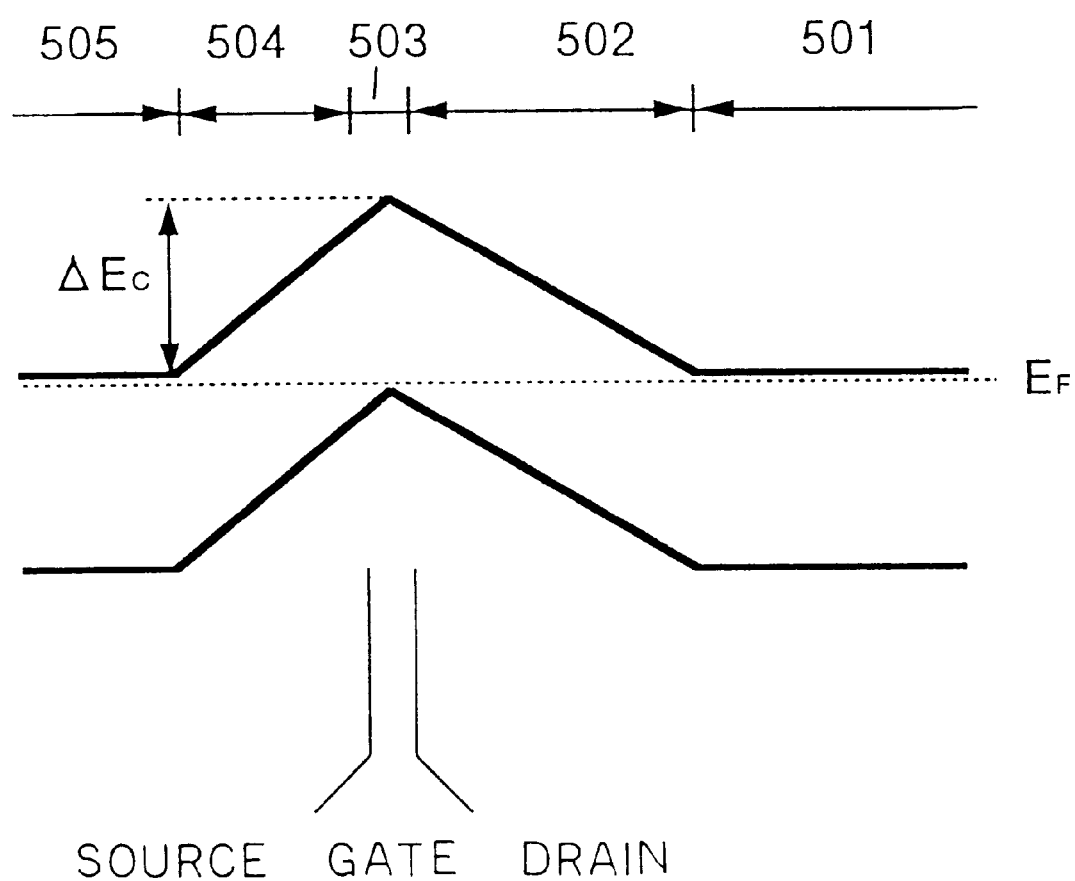
FIG. 29 is a band diagram of a conventional semiconductor electronic device in a thermal equilibrium condition.
Figure 30:
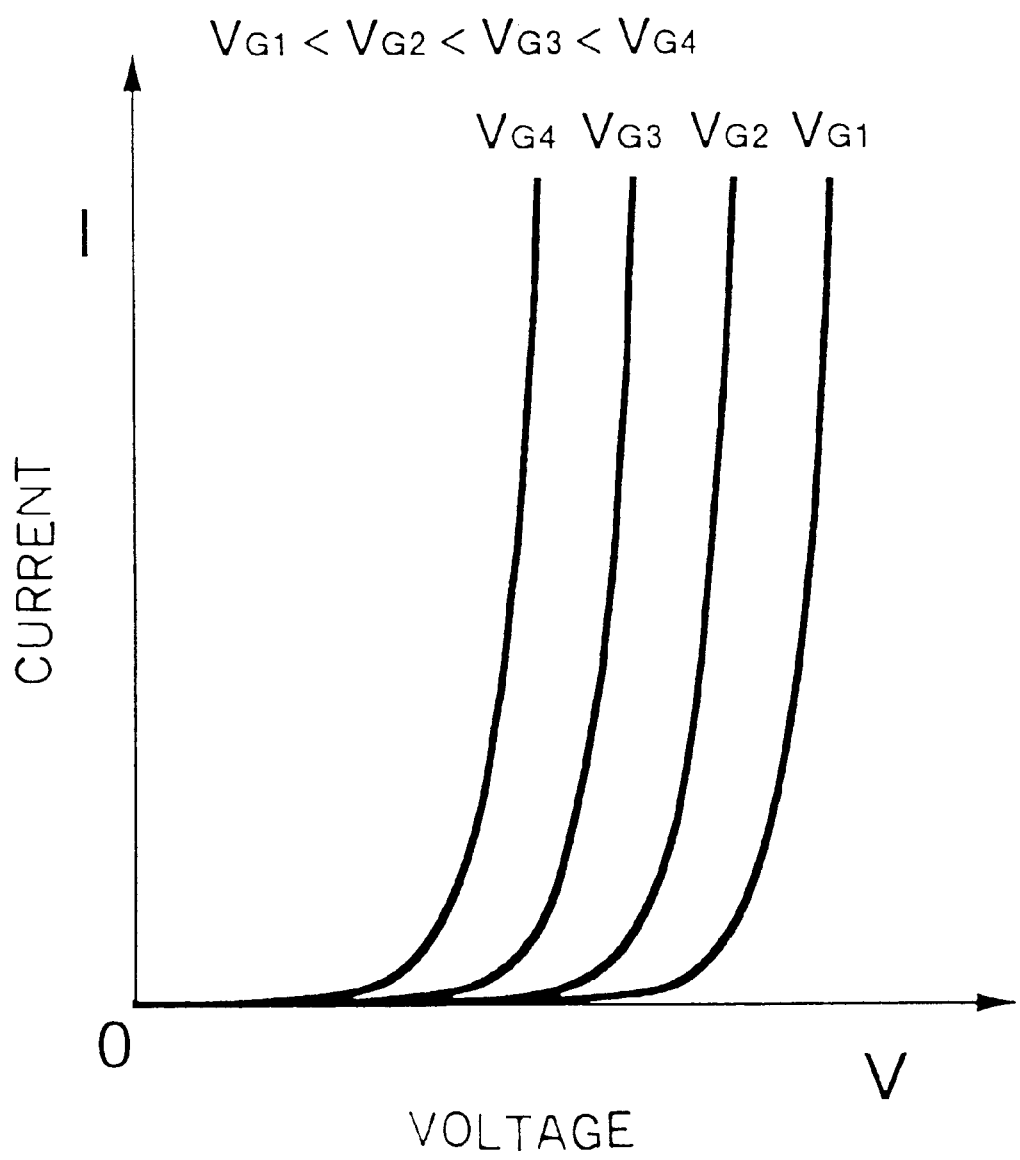
FIG. 30 shows voltage vs. current characteristics of the conventional semiconductor electronic device corresponding to different gate voltages applied thereto.
Figure 31:
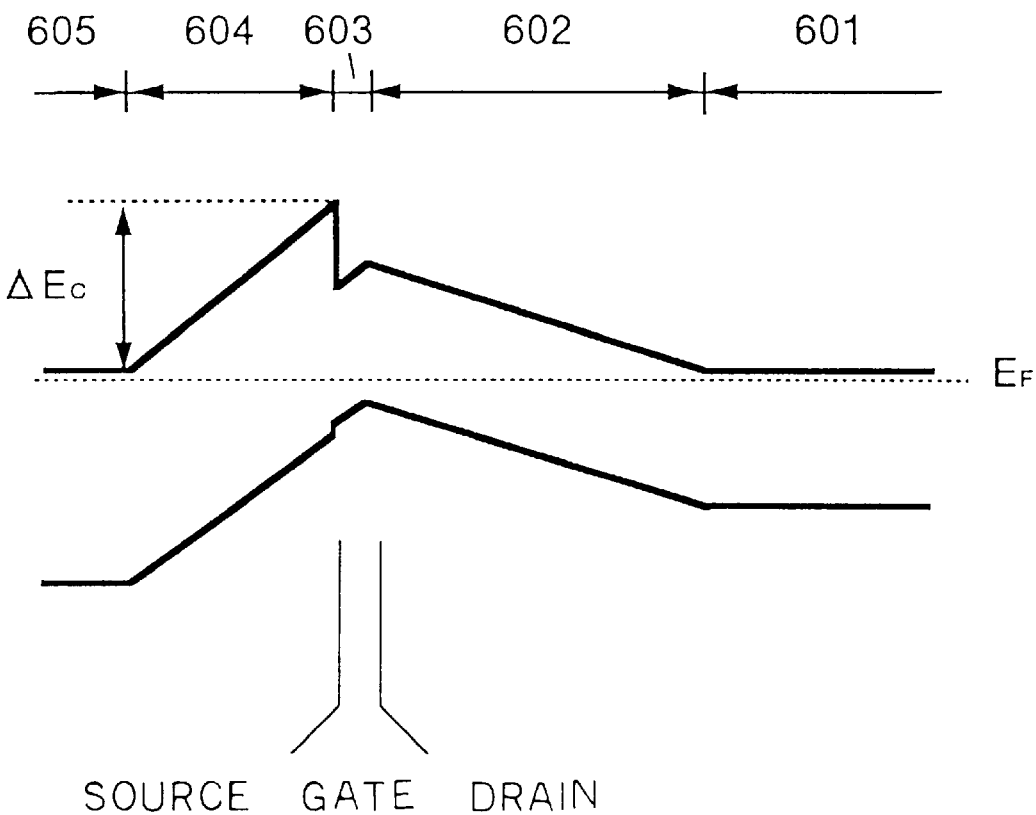
FIG. 31 is a band diagram of a conventional semiconductor optical element in a thermal equilibrium condition.
Figure 32:
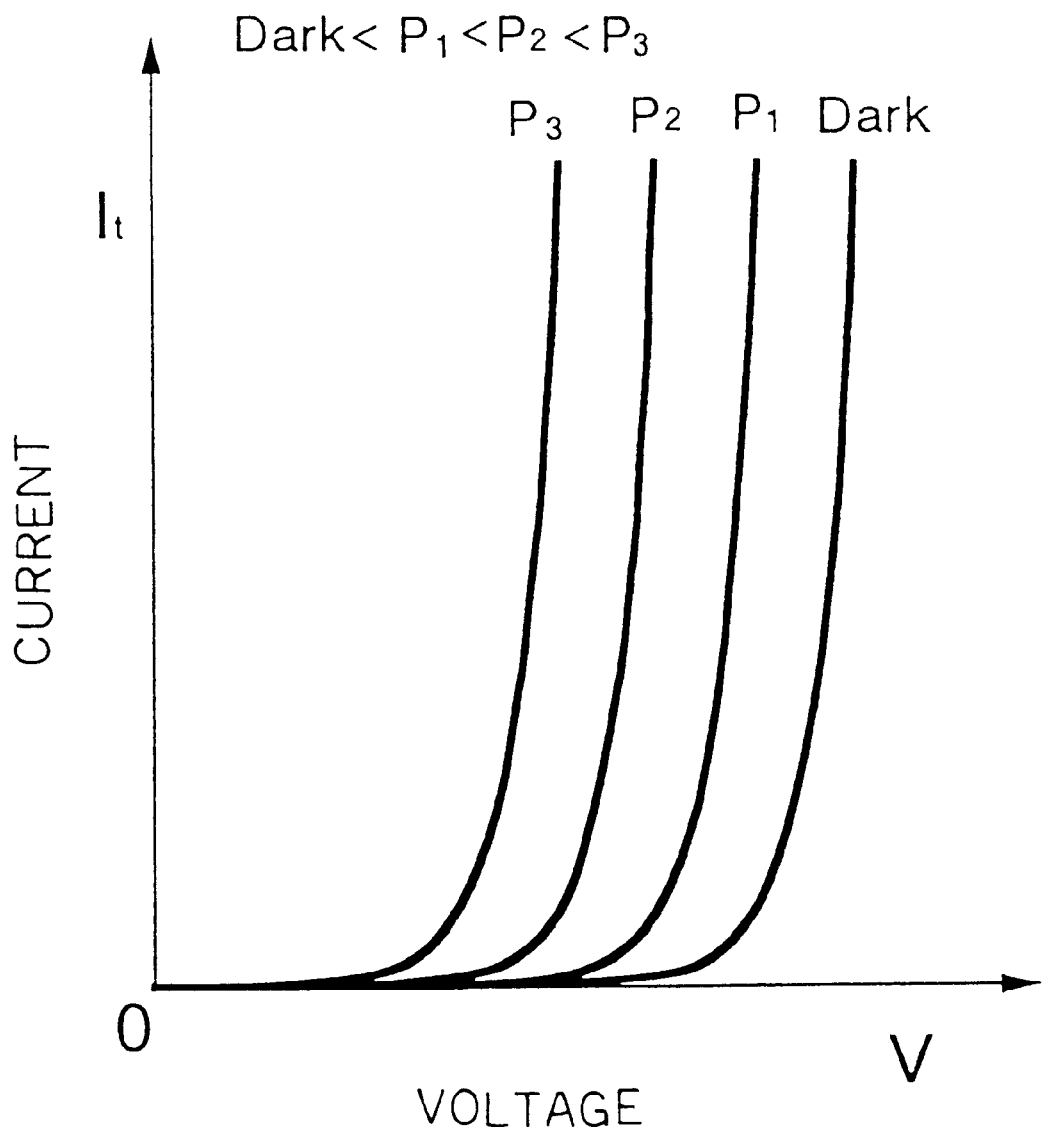
FIG. 32 shows voltage vs. current characteristics of the semiconductor optical element when irradiated with light of different powers.
Figure 33:
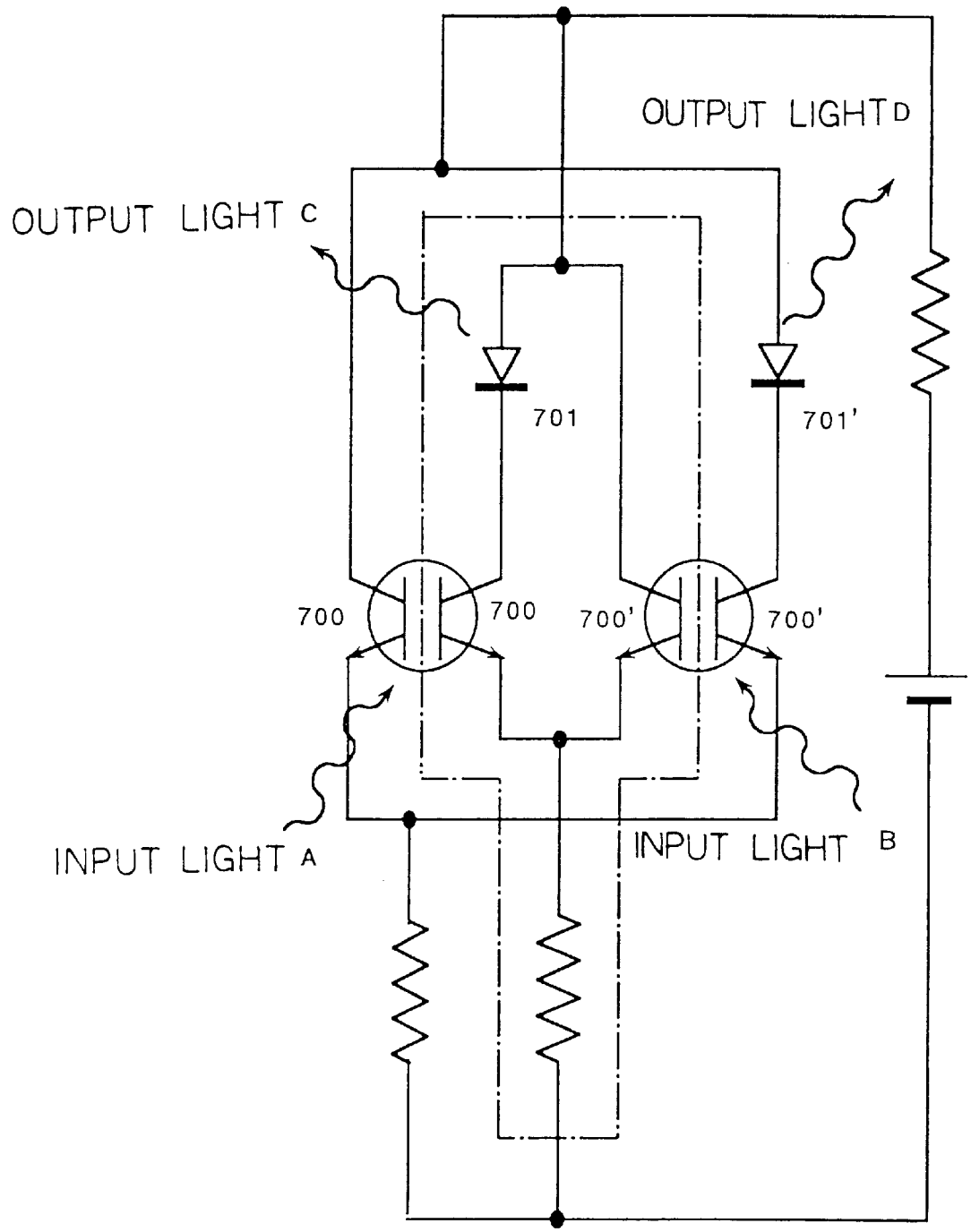
FIG. 33 is an equivalent circuit diagram of a conventional functional semiconductor optical element.

Each element is basically the DFB laser type having the $\lambda/4$ shift diffraction grating formed along the active layer as depicted in FIG. 14; in this embodiment, the output waveguide 213 as well as the active layer 202 are shown to be buried layers and the outputs from the respective elements are multiplexed by the optical multiplexer 214 into a composite output for emission as the output light $P_o$ from the end face 215. Next, the operation of this embodiment will be described. Each element is supplied with two kinds of bit patterns a and A from one of the two-input fibers 216 each having a fiber coupler. Since the bit strings a are usually input in time sequence, provision is made for spatially isolating the respective bits of the patterns at the same time instant by means of serial-parallel converters such fiber delay lines as shown in FIG. 28, and the converted outputs are provided to input ports $P_{1a}$, $P_{2a}$, $P_{3a}$, $P_{4a}$ and $P_{5a}$, respectively. Each bit pattern is coupled by the fiber coupler with one of the other bit patterns A which are provided to input ports $P_{1A}$, $P_{2A}$, $P_{3A}$, $P_{4A}$, and $P_{5A}$ in parallel, and the thus combined output is applied to the corresponding element. In each element, the combined incident light is absorbed in the light absorbing layer 204, and by the resulting carriers, the p-InGaAlAs or p-InGaAsP layer 205 is biased. At this time, the number of electrons which are injected into the active layer 202 varies with the incident light pattern as mentioned previously; only when the two bits are both "1's," the active layer 202 has a large gain and oscillates by the $\lambda/4$ shift diffraction grating 211 and the output light is emitted from the end face 215. On the other hand, when neither of the two bits are "1's" no electrons are injected into the active layer 202, and consequently, no output light is emitted from the end face 215. That is, in this element, only when all the pairs of bit patterns a and A match with each other at each bit position, the output $P_o$ from the end face is not equal to zero, and when a mismatch occurs even at one bit position, the output $P_o$=0 is provided; thus, the AND of the bit patterns can be judged in depending on whether the output light is emitted from the end face 215.

Furthermore, the output wavelength of each DFB laser is dependent on the period of the $\lambda/4$ shift diffraction grating 211; hence, by using a different period for the diffraction grating of each element and monitoring the output wavelength of the respective laser, it is possible to discriminate the AND of respective bits.

As described above, according to the present invention, the avalanche multiplication can be initiated and stopped. This permits implementation of a bistable element, as an electron device, which can be set and reset through modulation of its output current by the gate voltage. Moreover, it is possible to implement, as an optical device, an optical bistable element which has its output-light power modulated in accordance with the input-light power and can be set and reset optically. The element of the present invention can also be used as an avalanche photodiode which can be used with a low voltage, or as a multi-stable limiter by the introduction of a resonant tunneling diode and a plurality of quantum levels. Furthermore, an AND or OR element for optical pulse trains can be implemented by using a plurality of such elements.

While the above embodiments have been described on the assumption that the first conductivity type is n and the second conductivity type p, the same results as described above could be obtained even by reversing the conductivity types. That is, the triangular barrier region need not always be the n-i-p-i-n structure, but the avalanche multiplication can similarly be initiated and stopped in the i-type layers by p-i-n-i-p, n-i-p-i-p, n-i-n-i-p, n-i-n-i-n, p-i-n-i-n, p-i-p-i-p and p-i-p-i-n structures as well. Furthermore, the above embodiments have been described in connection with a case where the doping layer sandwiched between i-type layers is thin, that is, in connection with what is called a delta doped layer, but the invention is not limited specifically thereto and the doping layer may be thick as long as the avalanche multiplication can be initiated and stopped. The i-type layers may also be formed by a multi-quantum well structure, in which case it is possible to utilize the quantum-confining Stark effect by such a well structure. In a case of using, as majority carriers, holes normally having large mass, the introduction of strain permits reduction of the mass, enabling the high-speed operation. Moreover, the use of a plurality of elements according to the present invention provides more sophisticated capabilities. Besides, although the present invention has been described to use the InGaAlAs- and InGaAsP-series semiconductor materials, the invention is not limited specifically thereto but may use AlGaAs and non-lattice matching-series semiconductor materials and the Si-series materials as well. And, if necessary, an etching-stop layer such as an InP layer may also be used, in which case the same functional operation as mentioned above can likewise be achieved.

As described above in detail, the present invention is characterized in that the avalanche multiplication can be initiated and stopped in the i-type layer of the triangular barrier diode (TBD). In a case of an electron device, when the gate voltage is higher than a predetermined value, an output current is provided and a bistable characteristic by the gate voltage can be obtained. This provides a memory characteristic by set and reset pulses. In a case of an optical device, it is possible to implement an optical functional element which has a characteristic such that output light is emitted from the active layer only when the input-light power into the light absorbing layer exceeds a predetermined value, whereas when the input-light power does not have the predetermined value, no output light is generated. By introducing a two-input structure into such an element, it is possible to implement an optical AND or OR logic element, or bistable optical element which can be set and reset optically. This element can also be used as an avalanche photodiode which can be used with a low voltage. The element can also be employed as an optical limiter by adding a resonant tunneling diode. Furthermore, by using a plurality of such elements, it is possible to implement an ultrafast logical operation element for optical pulse trains, a multi-stable element and various other optical functional elements, which can be applied to optical computing technologies; hence, the present invention is of great utility.

What we claim is:

1. A functional semiconductor element, comprising:
a first semiconductor layer of a first or second conductivity type, a second semiconductor layer of an intrinsic type, a third semiconductor layer of the first or second conductivity type, a fourth semiconductor layer of an intrinsic type, and a fifth semiconductor layer of the first or second conductivity type, which are laminated in this order to provide a triangular barrier diode structure having one of n-i-p-i-n and p-i-n-i-p configurations, said third semiconductor layer having a thickness equal to or smaller than 0.1 $\mu$m and a doping concentration equal to or higher than $1.0 \times 10^{18}$ cm$^{-3}$; and avalanche multiplication means for initiating and stopping in a bistable operation manner an avalanche multiplication in said second or fourth semiconductor layer of intrinsic type in company with positive feedback with respect to a current flowing through the first semiconductor layer and the fifth semiconductor layer to provide a bistable function output in response to said bistable operation of the avalanche multiplication.

2. A functional semiconductor element according to claim 1, in which said avalanche multiplication means comprises means for controlling the potential of said third semiconductor layer to initiate and stop the avalanche multiplication in said second or fourth semiconductor layer of intrinsic type.

3. A functional semiconductor element, comprising:

a first semiconductor layer of a first conductivity type, a second semiconductor layer of an intrinsic type, a third semiconductor layer of a second conductivity type, a fourth semiconductor layer of the intrinsic type, and a fifth semiconductor layer of the first conductivity type, which are laminated in this order to provide a triangular barrier diode structure having n-i-p-i-n and p-i-n-i-p configurations, said third semiconductor layer having a thickness equal to or smaller than 0.1 $\mu$m and a doping concentration equal to or higher than $1.0 \times 10^{18}$ cm$^{-3}$; and avalanche multiplication means for initiating and stopping in a bistable operation manner an avalanche multiplication in said second or fourth semiconductor layer of intrinsic type in company with positive feedback with respect to a current flowing through the first semiconductor layer and the fifth semiconductor layer to provide a bistable function output in response to said bistable operation of the avalanche multiplication.

4. A functional semiconductor element according to claim 3, in which said avalanche multiplication means comprises means for controlling the potential of said third semiconductor layer to initiate and stop the avalanche multiplication in said second or fourth semiconductor layer of intrinsic type.

5. A functional semiconductor element according to claim 1 or 2, in which said in said second or fourth semiconductor layer is a light absorbing layer, said avalanche multiplication means comprising means for controlling irradiation of light on the functional semiconductor element to initiate and stop the avalanche multiplication in said second or fourth semiconductor layer of intrinsic type.

6. A functional semiconductor element according to claim 1 or 2, in which a light emitting layer or light modulating layer is included in said first to fifth semiconductor layers or further provided in addition to said first to fifth semiconductor layers.

7. A functional semiconductor element according to claim 1 or 2, in which at lest one resonant tunneling diode is included in said first to fifth semiconductor layers or further provided said first to fifth semiconductor layers.

8. A functional semiconductor element with electrical bistability for signal processing, comprising:

a first electrode for applying a positive bias voltage;

a substrate attached to said first electrode;

a first semiconductor layer of a first or second conductivity type;

a second semiconductor layer of an intrinsic type;

a third semiconductor layer of the first or second conductivity type;

a fourth semiconductor layer of the intrinsic type;

a fifth semiconductor layer of the first or second conductivity type;

a second electrode connected to said fifth semiconductor layer;

said first electrode, the first semiconductor layer, the second semiconductor layer, the third semiconductor layer, the fourth semiconductor layer, the fifth semiconductor layer and the second electrode being laminated in this order to provide a triangular barrier diode structure having one of n-i-p-i-n and p-i-n-i-p configurations; and a third electrode attached on said third semiconductor layer to apply a positive gate voltage across the second electrode and the third electrode to initiate and stop in a bistable operation manner an avalanche multiplication in said second or fourth semiconductor layer of intrinsic type in company with positive feedback with respect to a current flowing through the first semiconductor layer and the fifth semiconductor layer to provide a bistable function output in response to said bistable operation of the avalanche multiplication;

said third semiconductor layer having a thickness equal to or smaller than 0.1 $\mu$m and a concentration equal to or higher than $1.0 \times 10^{18}$ cm$^{-3}$.

9. A functional semiconductor element with electrical bistability for signal processing, comprising:

a first electrode for applying a positive bias voltage;

a substrate attached to said first electrode;

a first semiconductor layer of a first or second conductivity type used as an active layer;

a second semiconductor layer of an intrinsic type;

a third semiconductor layer of the first or second conductivity type used as a light absorbing layer;

a fourth semiconductor layer of the intrinsic type;

a fifth semiconductor layer of the first or second conductivity type for injecting thereto input light;

a second electrode connected to said fifth semiconductor layer;

said first electrode, the first semiconductor layer, the second semiconductor layer, the third semiconductor layer, the fourth semiconductor layer, the fifth semiconductor layer and the second electrode being laminated in this order to provide a triangular barrier diode structure having one of n-i-p-i-n and p-i-n-i-p, configurations; and a third electrode attached on said third semiconductor layer to apply a positive gate voltage across the second electrode and the third electrode to initiate and stop in a bistable operation manner an avalanche multiplication in said second or fourth semiconductor layer of intrinsic type in company with positive feedback with respect to a current flowing through the first semiconductor layer and the fifth semiconductor layer to provide a bistable function output in response to said bistable operation of the avalanche multiplication;

said third semiconductor layer having a thickness equal to or smaller than 0.1 $\mu$m and a doping concentration equal to or higher than $1.0 \times 10^{18}$ $^{l\ cm-3}$.

10. A functional semiconductor element according to claim 3 or 4, in which said second or fourth semiconductor layer is a light absorbing layer, said avalanche multiplication means comprising means for controlling irradiation of light on the functional semiconductor element to initiate and stop the avalanche multiplication in said second or fourth semiconductor layer of intrinsic type.

11. A functional semiconductor element according to claim 3 or 4, in which a light emitting layer or light modulating layer is included in said first to fifth semiconductor layers or further provided in addition to said first to fifth semiconductor layers.

12. A functional semiconductor element according to claim 3 or 4, in which at least one resonant tunneling diode is included in said first to fifth semiconductor layers or further provided said first to fifth semiconductor layers.

13. A functional semiconductor element according to claim 8 or 9, in which a light emitting layer or light modulating layer included in said first to fifth semiconductor layers or further provided in addition to said first to fifth semiconductor layers.

14. A functional semiconductor element according to claim 8 or 9, in which at least one resonant tunneling diode is included in said first to fifth semiconductor layers or further provided said first to fifth semiconductor layers.

* * * * *